US012581021B2

(12) United States Patent
Lee et al.

(10) Patent No.: US 12,581,021 B2
(45) Date of Patent: Mar. 17, 2026

(54) FLAT PANEL AND SCANNING DEVICE COMPRISING THE SAME

(71) Applicant: LG DISPLAY CO., LTD., Seoul (KR)

(72) Inventors: Shin-Bok Lee, Paju-si (KR); Nhohoon Myoung, Paju-si (KR); Hochun Yi, Paju-si (KR); Joosoo Lim, Paju-si (KR); Seonghoon Chun, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 465 days.

(21) Appl. No.: 17/774,388

(22) PCT Filed: May 13, 2021

(86) PCT No.: PCT/KR2021/006030
§ 371 (c)(1),
(2) Date: May 4, 2022

(87) PCT Pub. No.: WO2022/124496
PCT Pub. Date: Jun. 16, 2022

(65) Prior Publication Data
US 2023/0165107 A1 May 25, 2023

(30) Foreign Application Priority Data
Dec. 9, 2020 (KR) ........................ 10-2020-0171729

(51) Int. Cl.
*H04N 1/10* (2006.01)
*H10F 39/00* (2025.01)
(Continued)

(52) U.S. Cl.
CPC ........... *H04N 1/10* (2013.01); *H10F 39/8063* (2025.01); *H10K 59/126* (2023.02); *H10K 59/60* (2023.02);
(Continued)

(58) Field of Classification Search
CPC ............. H10K 59/60–65; H10K 59/40; H10K 59/126; H10K 2102/3031;
(Continued)

(56) References Cited

U.S. PATENT DOCUMENTS 7,948,471 B2     5/2011  Choo et al.
9,245,934 B2 *   1/2016  Chung ................... H10K 50/82
(Continued)

FOREIGN PATENT DOCUMENTS

CN        109256047 A      1/2019
KR        10-0730361 B1    6/2007
(Continued)

OTHER PUBLICATIONS

International Search Report and Written Opinion dated Sep. 13, 2021, for corresponding International Patent Application No. PCT/KR2021/006030.
(Continued)

*Primary Examiner* — Monica D Harrison
*Assistant Examiner* — Moataz Khalifa
(74) *Attorney, Agent, or Firm* — Morgan, Lewis & Bockius LLP

(57) ABSTRACT

A flat panel has a plurality of pixel areas each having a light emitting area, a light transmitting area, and a light sensing area in the light emitting area. The flat panel includes a first support board; a sensing array on the first support board and having a light sensing element corresponding to the light sensing area of each of the pixel areas; a micro lens between the first support board and the light sensing element; a first light shielding wall between the first support board and the light sensing element to correspond to an edge of the light sensing area of each of pixel areas; a light emitting array on the sensing array and having a light emitting element corresponding to the light emitting area of each of the pixel
(Continued)

areas; and a second support board on the light emitting array facing the first support board.

17 Claims, 17 Drawing Sheets

(51) Int. Cl.

| | |
|---|---|
| *H10K 59/12* | (2023.01) |
| *H10K 59/126* | (2023.01) |
| *H10K 59/131* | (2023.01) |
| *H10K 59/60* | (2023.01) |
| *H10K 59/65* | (2023.01) |
| *H10K 59/80* | (2023.01) |
| *H10K 102/00* | (2023.01) |

(52) U.S. Cl.
CPC ............. *H10K 59/65* (2023.02); *H10K 59/12* (2023.02); *H10K 59/131* (2023.02); *H10K 59/873* (2023.02); *H10K 59/878* (2023.02); *H10K 59/879* (2023.02); *H10K 2102/302* (2023.02)

(58) Field of Classification Search
CPC ........ H01L 27/14678; H01L 27/14627; H04N 1/10–195; H04N 2201/0081; H04N 2201/0091–0094
See application file for complete search history.

(56) References Cited

U.S. PATENT DOCUMENTS

| | | | |
|---|---|---|---|
| 9,250,657 B2 | 2/2016 | Kim et al. | |
| 9,395,842 B2 | 7/2016 | Kim et al. | |
| 9,465,429 B2 | 10/2016 | Kitchens, II et al. | |
| 9,494,995 B2 | 11/2016 | Kitchens, II et al. | |
| 9,547,919 B2 | 1/2017 | Kim et al. | |
| 9,606,606 B2 | 3/2017 | Kitchens, II et al. | |
| 9,620,576 B2 * | 4/2017 | Chung | H10K 59/8792 |
| 9,798,372 B2 | 10/2017 | Kitchens, II et al. | |
| 9,928,777 B2 | 3/2018 | Kim et al. | |
| 10,031,602 B2 | 7/2018 | Kitchens, II et al. | |
| 10,763,315 B2 | 9/2020 | Bang et al. | |
| 2005/0094216 A1 | 5/2005 | Wu | |
| 2010/0155578 A1 * | 6/2010 | Matsumoto | H10K 59/65 250/216 |
| 2014/0327051 A1 * | 11/2014 | Ahn | H01L 31/18 438/69 |
| 2017/0104019 A1 * | 4/2017 | Jung | H10F 39/805 |
| 2018/0173349 A1 | 6/2018 | Cho et al. | |
| 2020/0075570 A1 * | 3/2020 | Wang | H01L 27/1446 |
| 2020/0104563 A1 | 4/2020 | Ryu et al. | |
| 2020/0135817 A1 | 4/2020 | Wang et al. | |

FOREIGN PATENT DOCUMENTS

| | | |
|---|---|---|
| KR | 10-0782779 B1 | 12/2007 |
| KR | 10-2009-0041782 A | 4/2009 |
| KR | 10-2012-0119430 A | 10/2012 |
| KR | 10-1246785 B1 | 4/2013 |
| KR | 10-1348371 B1 | 1/2014 |
| KR | 10-2014-0130969 | 11/2014 |
| KR | 10-2015-0133337 A | 11/2015 |
| KR | 10-2015-0146200 A | 12/2015 |
| KR | 10-2016-0022525 A | 3/2016 |
| KR | 10-2017-0042940 A | 4/2017 |
| KR | 10-2017-0073958 A | 6/2017 |
| KR | 10-1783023 B1 | 9/2017 |
| KR | 10-2018-0004384 A | 1/2018 |
| KR | 10-1830604 B1 | 2/2018 |
| KR | 10-2020-0037653 A | 4/2020 |
| KR | 102572966 B1 * | 9/2023 |
| WO | 2018/180577 A1 | 10/2018 |

OTHER PUBLICATIONS

Office Action issued on May 19, 2025 in Korean Patent Application No. 10-2020-0171729 (Note: US2020/0075570A1 and US2010/0155578A1 cited therein are already of record.).

Office Action issued on Jan. 16, 2026 in Chinese Patent Application No. 202180006509.5 with English translation (Note: U.S. Pat. No. 2014327051A1 cited therein is already of record.).

* cited by examiner

<u>100</u>

FLAT PANEL AND SCANNING DEVICE COMPRISING THE SAME

BACKGROUND

Field

Disclosed herein are a scanning device which generates a digital image signal in relation to a print out, and a flat panel with which the scanning device is provided.

Description of Related Art

Scanning devices generate a digital image signal in relation to a print out. A scanning device generates a digital image signal, based on results of the measurement of an amount of light reflected from a printout put on a flat transparent support board for each pixel area.

The scanning device is usually implemented in a large size, difficult to carry, and causes user inconvenience because users need to manually place an object to be scanned on the flat transparent support board one by one, resulting in limitations on its availability.

Currently, it is relatively easy to manufacture a panel where light sensing elements are integrated. Accordingly, a portable scanning device implemented as a flat plate is on the market.

In an example, a flat plate-shaped scanning device is provided with a flat panel including a light emitting element irradiating light in each pixel area, and a light sensing element sensing an amount of light in each pixel area. The flat plate-shaped scanning device has become relatively lightweight and small. In the case of a flat plate-shaped scanning device, users control on/off of scanning operation in a state in which the scanning device is placed on an object to be scanned such that a digital image signal in relation to the object to be scanned is generated relatively easily.

DISCLOSURE

Technical Purpose

A flat plate-shaped scanning device can be provided with a flat transparent panel to improve convenience and allow a user to control scanning operation while the user directly checks an object to be scanned.

The flat transparent panel includes a light transmitting area that is arranged in a way that a light transmitting area alternates with a pixel area. A light emitting element and a light sensing element corresponding to each pixel area are disposed. However, the light transmitting area transmits light with no light emitting element and light sensing element therein. Accordingly, the user can recognize an object disposed under the flat panel and aware that the flat panel is transparent.

In the case of a flat transparent panel, the light sensing element of each pixel area can sense light that is not generated in each pixel area, through the light transmitting area.

Additionally, in the case of a flat transparent panel, light of some pixel areas can be delivered to the light sensing element of an adjacent pixel area through the light transmitting area.

In a flat panel that provides the function of displaying an image using the light emitting element of each pixel area, the light emitting element's light can be incident directly to a light sensing sensor in a state in which the light emitting element's light is not reflected from an object to be scanned.

As described above, light having various paths can be incident to the light sensing element, resulting in deterioration of the accuracy of a detection signal generated by the light sensing element.

According to the present disclosure, a flat panel and a scanning device including the same that can ensure improvement in the accuracy of a detection signal generated by the light sensing element is provided to solve the above problems.

Aspects according to the present disclosure are not limited to the above ones, and other aspects and advantages that are not mentioned above can be clearly understood from the following description and can be more clearly understood from the embodiments set forth herein. Additionally, the aspects and advantages in the present disclosure can be realized via means and combinations thereof that are described in the appended claims.

Technical Solution

In one embodiment, a flat panel may include a plurality of pixel areas, each of the plurality of pixel areas, including a light emitting area emitting light, a light transmitting area being adjacent to the light emitting area and transmitting light, and a light sensing area constituting a portion of the light emitting area and sensing light, may include a sensing array disposed on a first support board and including a light sensing element corresponding to the light sensing area of each of the plurality of pixel areas, a micro lens disposed between the first support board and the light sensing element, a first light shielding wall disposed between the first support board and the light sensing element and corresponding to an edge of the light sensing area of each of the plurality of pixel areas, and a light emitting array disposed between the sensing array and a second support board and including a light emitting element corresponding to the light emitting area of each of the plurality of pixel areas.

With the micro lens corresponding to the light sensing area of each pixel area, light rays reflected from an object to be scanned disposed below the first support board may be converged by the micro lens and then incident to the light sensing element, leading to an increase in the amount of light rays incident to the light sensing element among the light rays reflected from the object to be scanned.

The first light shielding wall corresponding to the edge of the light sensing area of each pixel area may block light, which is not generated and reflected in each pixel area, from being delivered to the micro lens through the light transmitting area.

First and second electrodes of the light emitting element may be made of a transparent conductive material or a semitransparent conductive material in each. Additionally, the light emitting array may further include a light shielding-reflecting layer corresponding to a portion of the light emitting area of each of the plurality of pixel areas and disposed under the first electrode.

With the first and second electrodes and the light shielding-reflecting layer, the light emitting element's light may be emitted to one side, i.e., toward the second support board in a portion of the light emitting area of each pixel area, and the light emitting element's light may be emitted to both sides, i.e., toward the first support board and the second support board in the remaining portion of the light emitting area of each pixel area.

Since the light shielding-reflecting layer is disposed between the light emitting element and the light sensing element, the light emitting element's light emitted toward the first support board may be prevented from being directly incident to the light sensing element.

Since the flat panel includes the plurality of pixel areas including the light transmitting area respectively, the flat panel may look transparent. Further, the flat panel may ensure improvement in the accuracy of a detection signal generated by the light sensing element with the micro lens, the first light shielding wall and the light shielding-reflecting layer.

The flat panel in one embodiment may further include a second light shielding wall that surrounds the light emitting area of each of the plurality of pixel areas.

The second light shielding wall may block a light path between adjacent pixel areas, leading to improvement in the accuracy of a detection signal generated by the light sensing element.

The flat panel in one embodiment may further include an electromagnetic shielding pattern disposed between the sensing array and the light emitting array.

The electromagnetic shielding pattern may block signal interference between the sensing array and the light emitting array.

In another embodiment, a scanning device is provided with the flat panel described above.

Technical Effects

A flat panel in several embodiments includes a plurality of pixel areas including a light transmitting area transmitting light respectively such that the flat panel looks transparent.

The flat panel in each embodiment includes a first light shielding wall corresponding to an edge of a light sensing area of each pixel area. Accordingly, light, which is not reflected from an object to be scanned disposed under a first support board, in the light sensing area of each pixel area, may be prevented from being incident to a light sensing element of each pixel area.

The flat panel in each embodiment further includes a light shielding-reflecting layer disposed between a light emitting element and a light sensing element and corresponding to a portion of a light emitting area. Accordingly, light incident from the light emitting element directly to the light sensing element may be blocked.

The flat panel in one embodiment further includes a second light shielding wall that surrounds the light emitting area of each pixel area. Thus, a path, in which light generated in some pixel areas is delivered to the light sensing element of an adjacent pixel area through the light transmitting area of each pixel area, may be blocked.

Thus, the flat panel looks transparent, and the accuracy of a detection signal generated by the light sensing element may improve.

DETAILED DESCRIPTIONS

Figure 1:
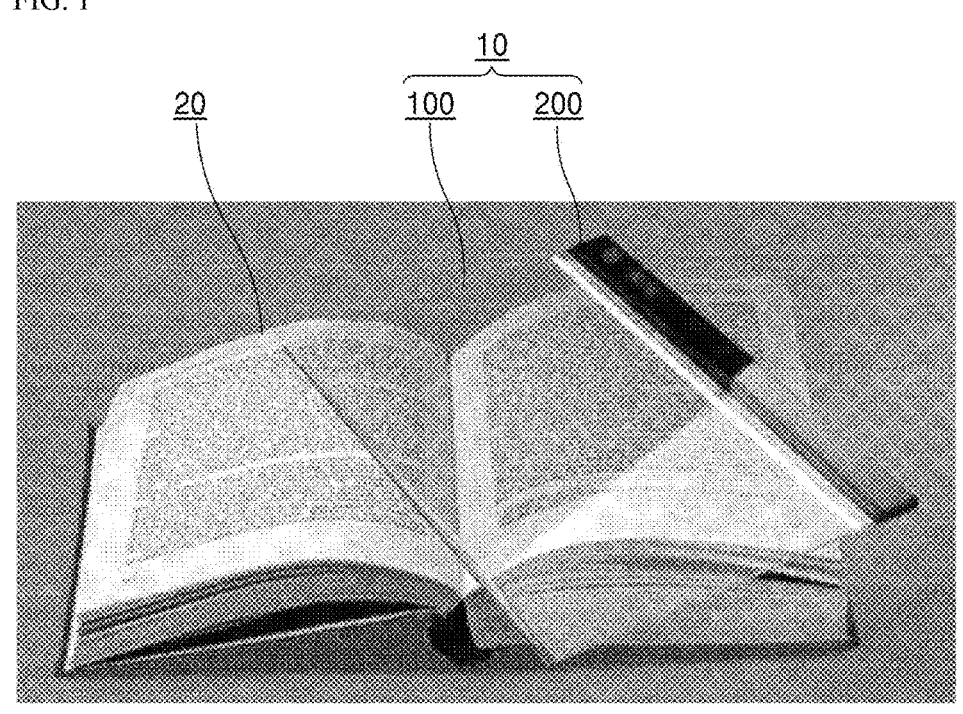
FIG. 1 is a view showing an example in which a flat panel-shaped scanning device is used.

The above-described aspects, features and advantages are specifically described hereafter with reference to the accompanying drawings such that one having ordinary skill in the art to which the present disclosure pertains can easily implement the technical spirit of the disclosure. In the disclosure, detailed description of known technologies in relation to the disclosure is omitted if it is deemed to make the gist of the disclosure unnecessarily vague. Below, preferred embodiments according to the disclosure are specifically described with reference to the drawings. In the drawings, identical reference numerals can denote identical or similar components.

A scanning device provided with a flat panel in each embodiment is described with reference to FIGS. 1 to 5.

Figure 2:
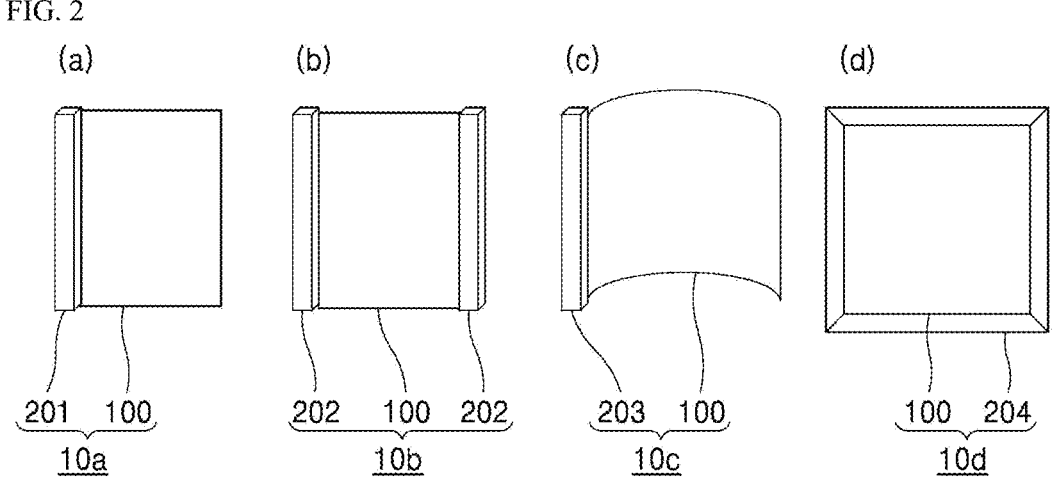
FIG. 2 is a view showing examples of a flat panel-shaped scanning device.
Figure 3:
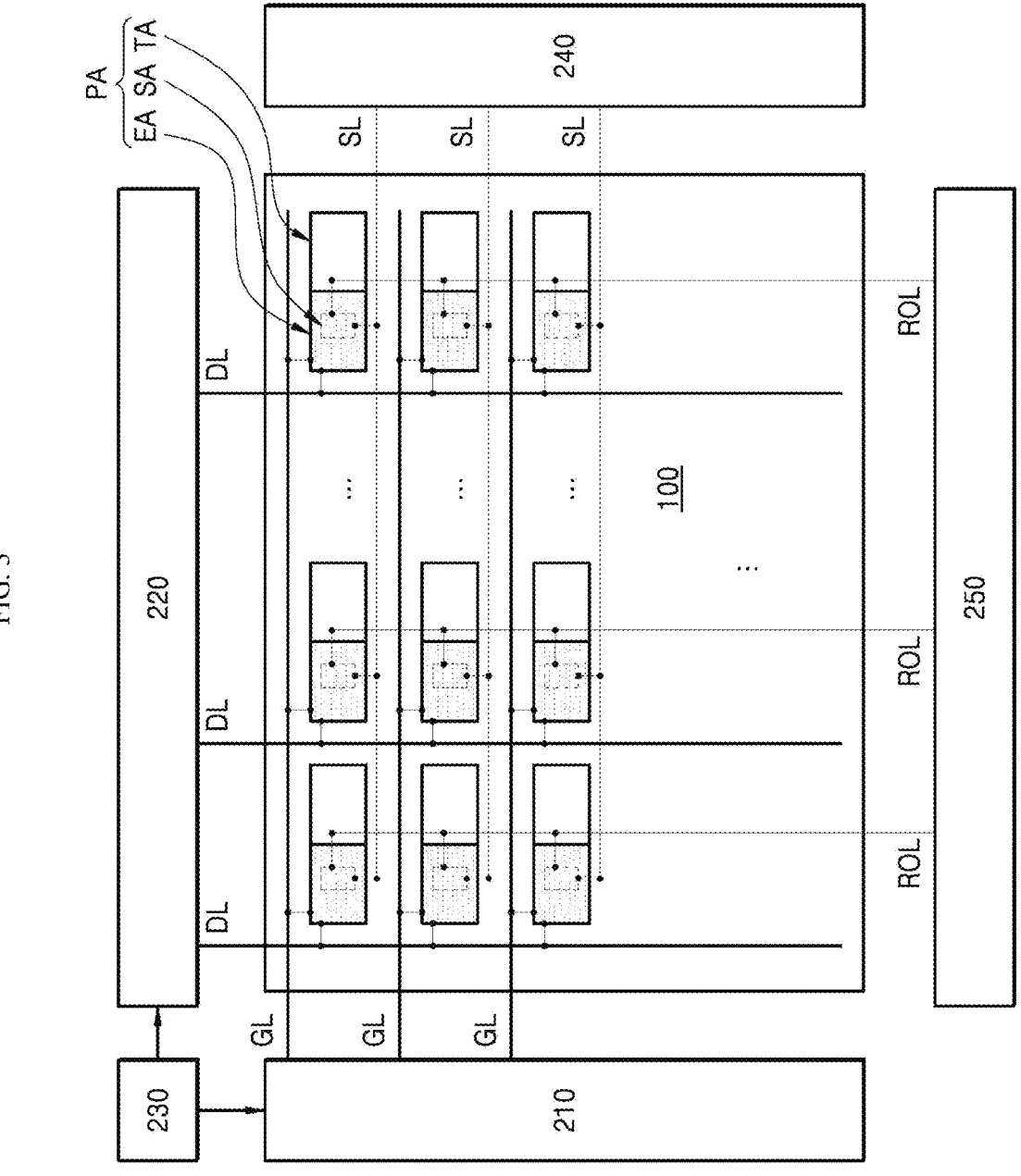
FIG. 3 is a view showing a flat panel and a panel driver.
Figures 4, 5:
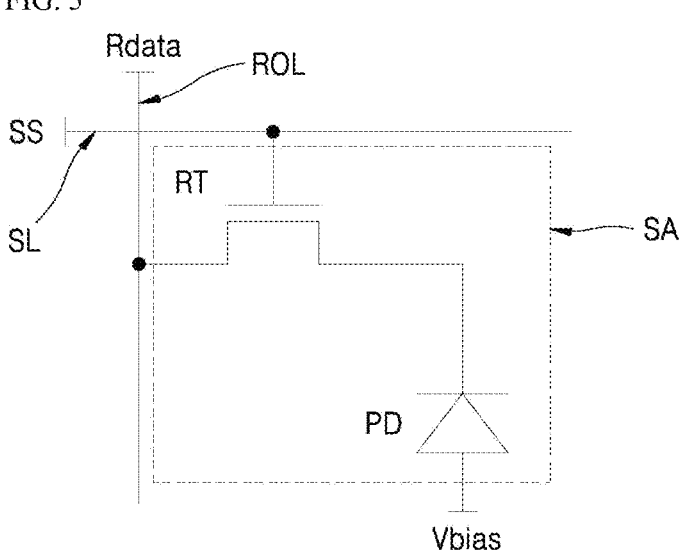
FIG. 4 is a view showing an example of an equivalent circuit corresponding to a light emitting area in FIG. 3.
FIG. 5 is a view showing an example of an equivalent circuit corresponding to a light sensing area in FIG. 3.

FIG. 1 is a view showing an example in which a flat panel-shaped scanning device is used. FIG. 2 is a view showing examples of a flat panel-shaped scanning device. FIG. 3 is a view showing a flat panel and a panel driver. FIG. 4 is a view showing an example of an equivalent circuit corresponding to a light emitting area in FIG. 3. FIG. 5 is a view showing an example of an equivalent circuit corresponding to a light sensing area in FIG. 3.

As illustrated in FIG. 1, a scanning device 10 may include a flat panel 100 that performs scanning, and a side part 200 that is fixed to an edge of at least one side of the flat panel 100.

The scanning device 10 may perform a scanning operation based on a user's input, in a state of being put on a flat object 20 to be scanned such as a printout and the like. The scanning operation may involve irradiating light to an object to be scanned 20 and sensing an amount of light reflected from the object to be scanned 20 by each pixel area, and based on a detection signal corresponding to the amount sensed by each pixel area, generating a digital image signal corresponding to the object to be scanned 20.

To this end, the flat panel 100 may include a lighting emitting element and a light sensing element that correspond to each pixel area.

Additionally, the flat panel 100 may be a transparent panel such that the user controls the scanning operation while the user recognizes the object to be scanned 20 directly. That is, in the flat panel 100, each pixel area may include a light emitting area that emits light, a light sensing area that senses light, and a light transmitting area that transmits light.

Further, in each pixel area of the flat panel 100, the light sensing element may be disposed closer to the object to be scanned 20 than the light emitting element, to reduce a loss of the light reflected from the object to be scanned 20 in a path to the light sensing element. That is, under the assumption that the flat panel 100 is placed on an object to be scanned 20, the light emitting element may be disposed on the light sensing element.

The flat panel 100 is described hereafter specifically with reference to the accompanying drawings.

A circuit board for driving the flat panel 100 and the like is stored in the side part 200. Since the side part 200 is not an area in which scanning operation is performed, the side part may be further used as an interface for receiving the user's control input, a supporter of the flat panel 100 and the like.

As illustrated in FIG. 2(a), the side part 201 may be disposed in parallel with one of the relatively long sides of the edges of the flat panel 100 having a rectangle shape, for example.

However, the position of the side part 200 may vary depending on the user's convenience and the flat panel 100's strength.

That is, the side part 202, as illustrated in FIG. 2(b), may be disposed in parallel with each of the two relatively long sides of the edges of the flat panel 100 having a rectangle shape.

Alternatively, the flat panel 100, as illustrated in FIG. 2(c), may be made of a soft material that can bend, and the bent flat panel 100 may be further stored in the side part 203.

Alternatively, the side part 204, as illustrated in FIG. 2(d), may be disposed in parallel with each of the four sides forming the edges of the flat panel 100 having a rectangle shape. That is, the side part 204 may be disposed to surround the flat panel 100.

The panel driver implemented as a circuit board (not illustrated) stored in the side part (200 in FIG. 1) provides a driving signal for driving the light emitting element of the flat panel 100 and reads out a detection signal of the light sensing element.

The flat panel 100, as illustrated in FIG. 3, has a plurality of pixel areas (PA) that is arranged in a matrix form in an active area where scanning is performed.

Each of the plurality of pixel areas PA includes a light emitting area EA that emits light, a light transmitting area TA that transmits light, and a light sensing area SA that senses an amount of light. The light sensing area SA is used to sense an amount of light that is emitted from the light emitting area EA and reflected from an object to be scanned (20 in FIG. 1), and constitutes a portion of the light emitting area EA.

The panel driver 210, 220, 230, 240, 250 may provide a gate signal and a data signal for driving a light emitting element disposed in the light emitting area EA, and a scan signal for selecting a light sensing element that reads out a detection signal, among light sensing elements corresponding to each light sensing area SA, to the flat panel 100, and receive a detection signal of a selected light sensing element.

The flat panel 100 further includes a gate line GL for providing a gate signal (GS in FIG. 4) to the plurality of pixel areas PA, a data line DL for providing a data signal (Vdata in FIG. 4) to the plurality of pixel areas PA, a scan line SL for providing a scan signal (SS in FIG. 5) to the plurality of pixel areas PA, and a read-out line ROL for receiving a detection signal (Rdata in FIG. 5) from each of the plurality of pixel areas PA.

The panel driver include a gate driver 210 that provides a gate signal to the gate line GL of the flat panel 100, a data driver 220 that provides a data signal to the data line DL of the flat panel 100, a timing controller 230 that controls a drive timing of the gate driver 210 and a drive timing of the data driver 220, a scan driver 240 that provides a scan signal to the scan line SL of the flat panel 100, and a read-out driver 250 that receives a detection signal from the read-out line SL of the flat panel 100.

The timing controller 230 may further control a drive timing of the scan driver 240 and a drive timing of the read-out driver 250.

In an example, the timing controller 230 may control the gate driver 210 and the data driver 220 such that the light emitting areas EA of all the pixel areas PA emit light during a predetermined light-emitting period, based on the user's scanning control input, and may control the scan driver 240 and the read-out driver 240 such that receive a detection signal corresponding to an amount of light incident to the light sensing areas SA of all the pixel areas PA during a sensing period after the predetermined light emitting period.

In another example, in a flat panel 100 that provides the function of displaying an image, the timing controller 230 realigns digital video data RGB input from the outside according to resolution of the active area, and provides the realigned digital video data RGB' to the data driver 220.

Additionally, the timing controller 230 provides a data control signal DDC for controlling an operation timing of the data driver 220, and a gate control signal GDC for controlling an operation timing of the gate driver 210, based on timing signals such as a vertical synchronization signal Vsync, a horizontal synchronization signal Hsync, a dot clock signal DCLK, a data enable signal DES and the like.

The gate driver 210 provides a gate signal GS consecutively to a plurality of gate lines GL, based on the gate control signal GDC. The plurality of gate lines GL corresponds to the plurality of pixel areas PA, and each gate line GL connects to pixel areas PA aligned horizontally in parallel among the plurality of pixel areas PA.

That is, the gate driver 210 provides a gate signal GS to each gate line GL during each display horizontal period corresponding to each gate line GL of any one frame period included in an image display period.

The data driver 220 converts the realigned digital video data RGB' to an analogue data voltage, based on the data control signal DDC. The data driver 220 provides each data signal Vdata to the data line DL in pixel areas PA to which gate signals GS are provided during each display horizontal period based on the realigned digital video data RGB'.

Further, the timing controller 230 may provide a scan control signal for controlling an operation timing of the scan driver 240, and a read-out control signal for controlling an operation timing of the read-out driver 250, based on the user's scanning control input.

The scan driver 240 provides a scan signal SS consecutively to a plurality of scan lines SL, based on the scan control signal. That is, the scan driver 240 provides a scan signal SS to each scan line SL during a sensing horizontal period of a sensing period, which corresponds to each scan line SL.

The read-out driver 250 reads out each detection signal from pixel areas PA to which a scan signal SS is provided during each sensing horizontal period, through the read-out line ROL, based on the read-out control signal.

As illustrated in FIG. 4, the light emitting area EA of each pixel area PA corresponds to a light emitting element OLED and a light emitting-driving circuit T1, T2, T3, Cst for driving the light emitting element OLED.

In an example, the light emitting-driving circuit may include a first transistor T1, a second transistor T2, a third transistor T3, and a storage capacitor Cst.

The first transistor T1 is disposed between the data line DL and a first node n1.

The first node n1 connects to a gate electrode of the second transistor T2 and one end of the storage capacitor Cst.

The first transistor T1 is turned on based on a gate signal GS provided to the gate line GL, and a data signal Vdata provided to the data line DL is delivered to the first node n1 through the first transistor T1 that is turned on.

The second transistor T2 is disposed in series with a light emitting element OLED, between a first driving power source line VDDL supplying a first driving power source EVDD and a second driving power source line VSSL supplying a second driving power source EVSS having a lower electric potential than the first driving power source EVDD.

The storage capacitor Cst is disposed between the first node n1 and the second node n2. The second node n2 is a contact point between the second transistor T2 and the light emitting element OLED. The storage capacitor Cst may be charged with the data signal Vdata provided to the first node n1.

The second transistor T2 is turned on based on the data signal Vdata provided to the first node n1 and a charging voltage of the storage capacitor Cst, and supplies driving current corresponding to the data signal Vdata to the light emitting element OLED.

The third transistor T3 is disposed between a reference power source line VREL supplying a reference power source Vref for initializing the light emitting element OLED, and the second node n2. The third transistor T3 is turned on based on the gate signal GS provided to the gate line GL, and the electric potential of the second node n2 is converted to an electric potential the same as the reference power source Vref through the third transistor T3 that is turned on.

As illustrated in FIG. 5, the light sensing area SA of each pixel area PA includes a read-out circuit RT for reading out the light sensing element (PD; photo diode), and a detection signal generated by the light sensing element PD.

In an example, the read-out circuit may include a read-out transistor RT.

The light sensing element PD is disposed between the read-out transistor RT and a bias line BL. The bias line BL is used for supplying a bias power source Vbias to the light sensing element PD.

The read-out transistor RT is disposed between the light sensing element PD and the read-out line ROL.

When light is incident to the light sensing element PD, the light sensing element PD generates a detection signal corresponding to an amount of the light incident to the light sensing element PD, based on the bias power source Vbias.

The read-out transistor RT is turned on based on the scan signal SS provided to the scan line SL, and the detection signal Rdata generated by the light sensing element PD is delivered to the read-out line ROL through the read-out transistor RT that is turned on.

For example, the read-out driver (250 in FIG. 3) may amplify the detection signal Rdata delivered through the read-out line ROL, and based on the amplified detection signal Rdata, generate a light amount level signal, and combine a light amount level signal corresponding to the light sensing area SA of each pixel area PA and generate a digital image signal.

Hereafter, a flat panel in each embodiment is described.

A flat panel EM1 in one embodiment is described with reference to FIGS. 6 to 12.

Figure 6:
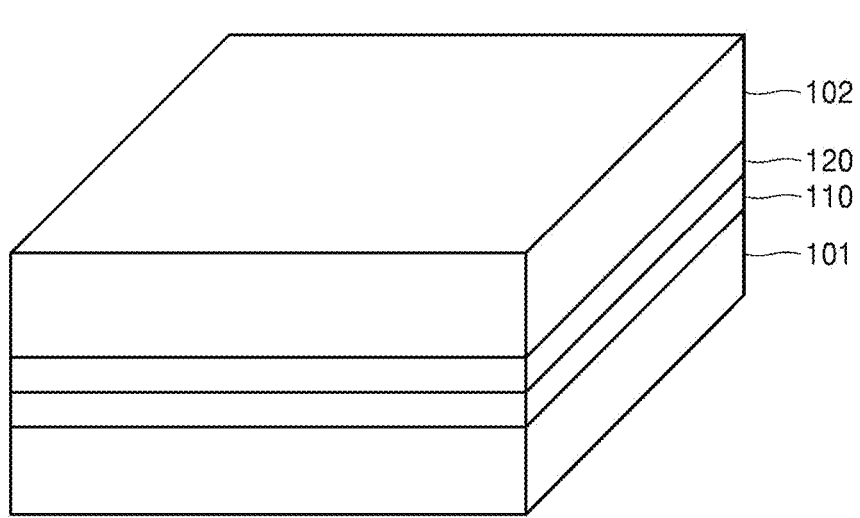
FIG. 6 is a view showing a flat panel in FIGS. 1 and 2.
Figure 7:
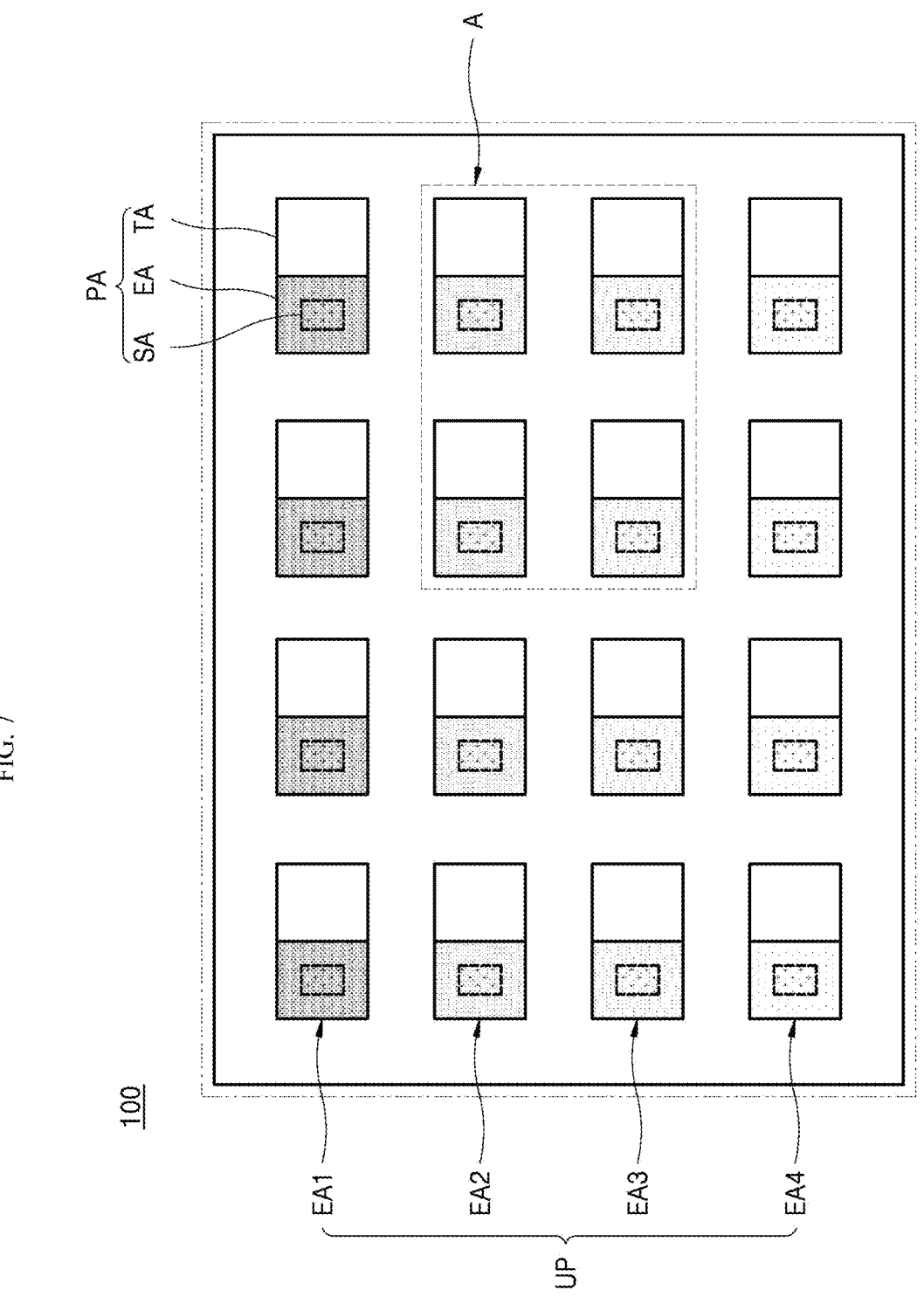
FIG. 7 is a view showing a portion of the flat panel in FIG. 6.
Figure 8:
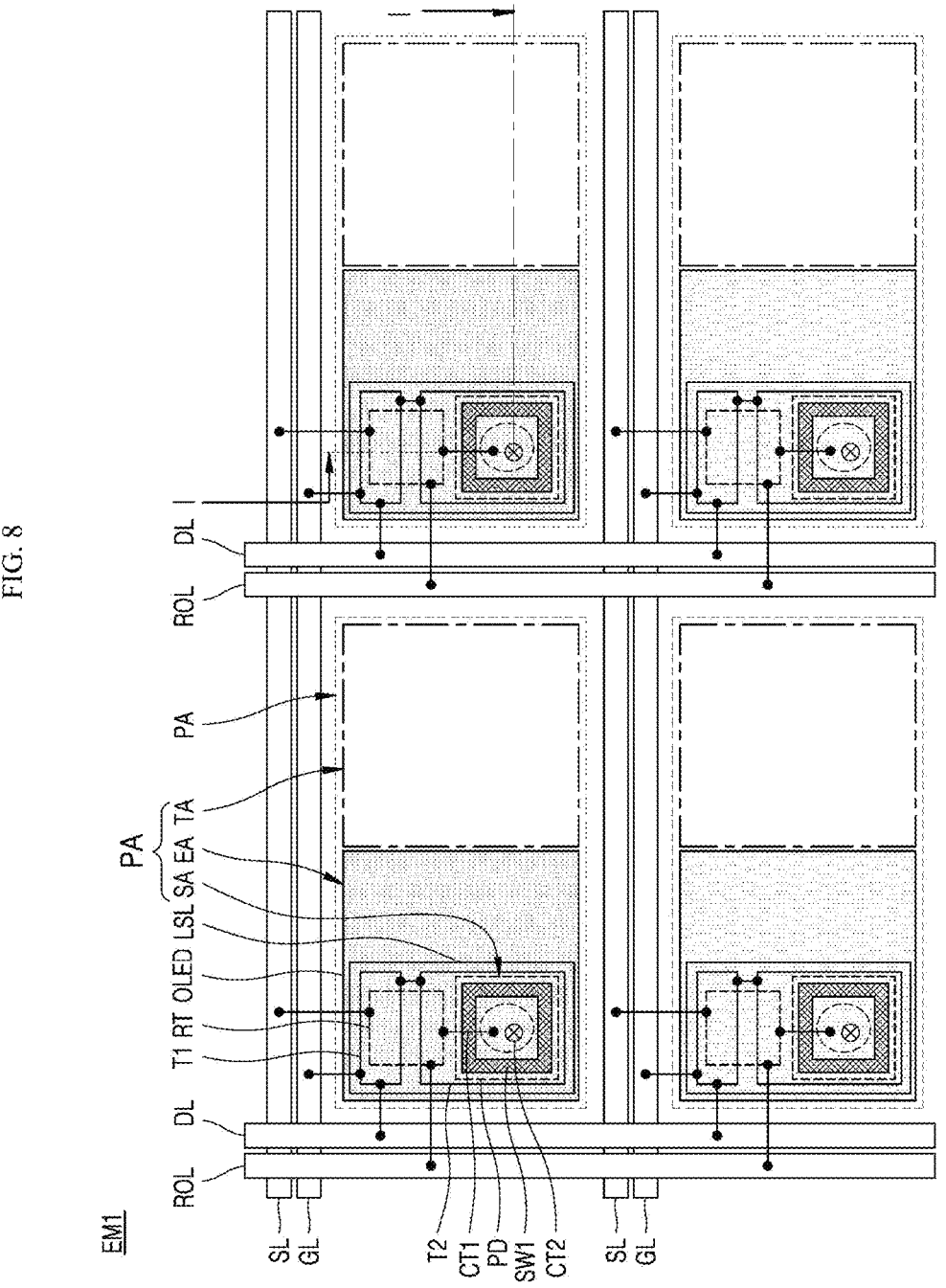
FIG. 8 is a view showing portion A of FIG. 7 in one embodiment.
Figure 9:
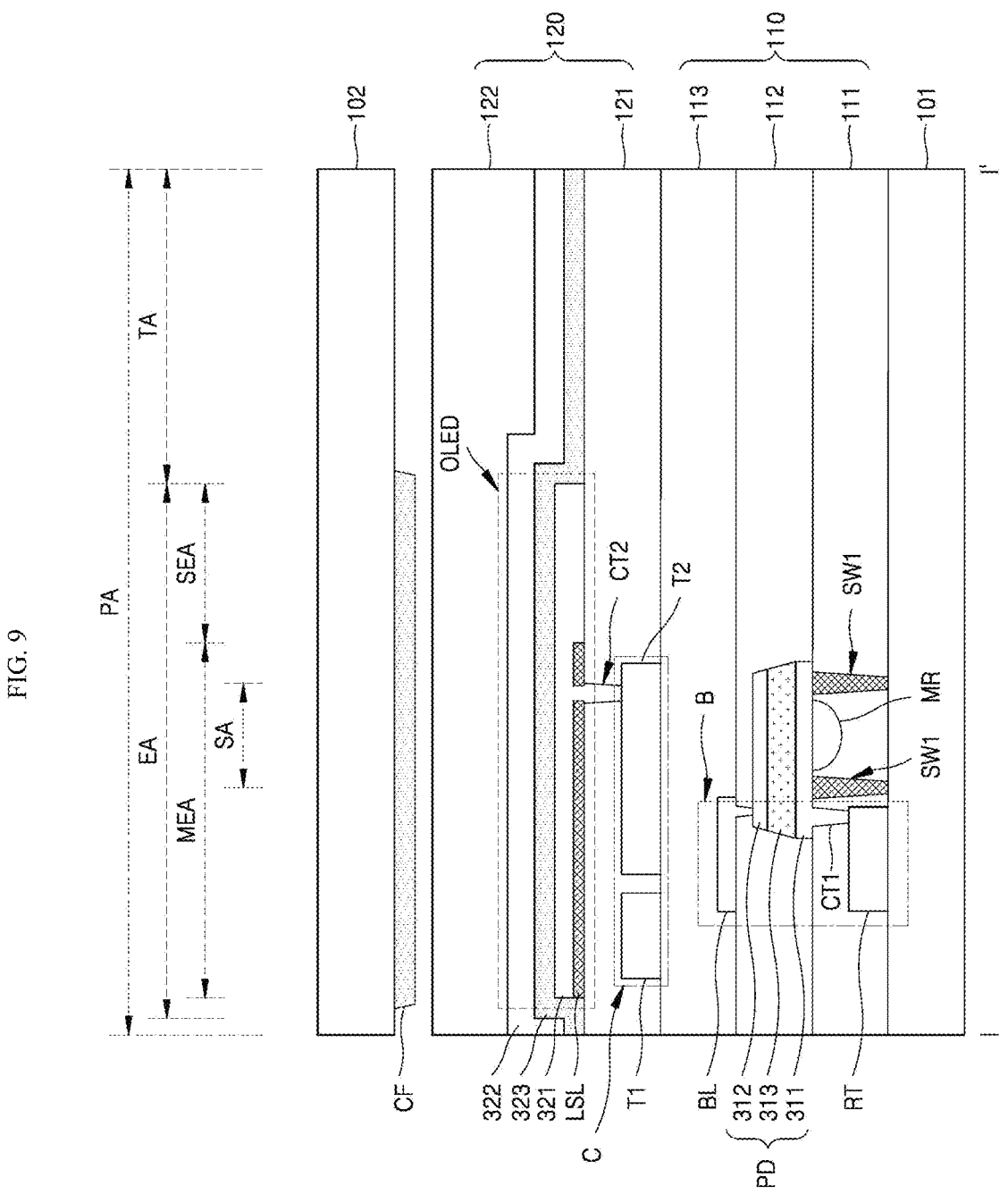
FIG. 9 is a view showing a cross section along I-I' of FIG. 8.
Figures 10, 11:
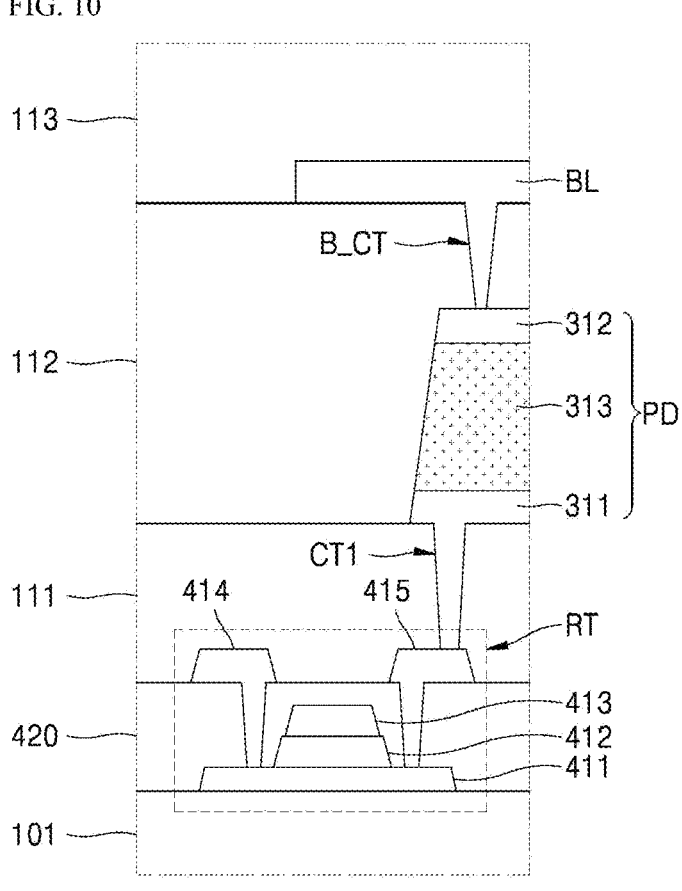
FIG. 10 is a view showing portion B of FIG. 9.
FIG. 11 is a view showing portion C of FIG. 9.
Figure 12:
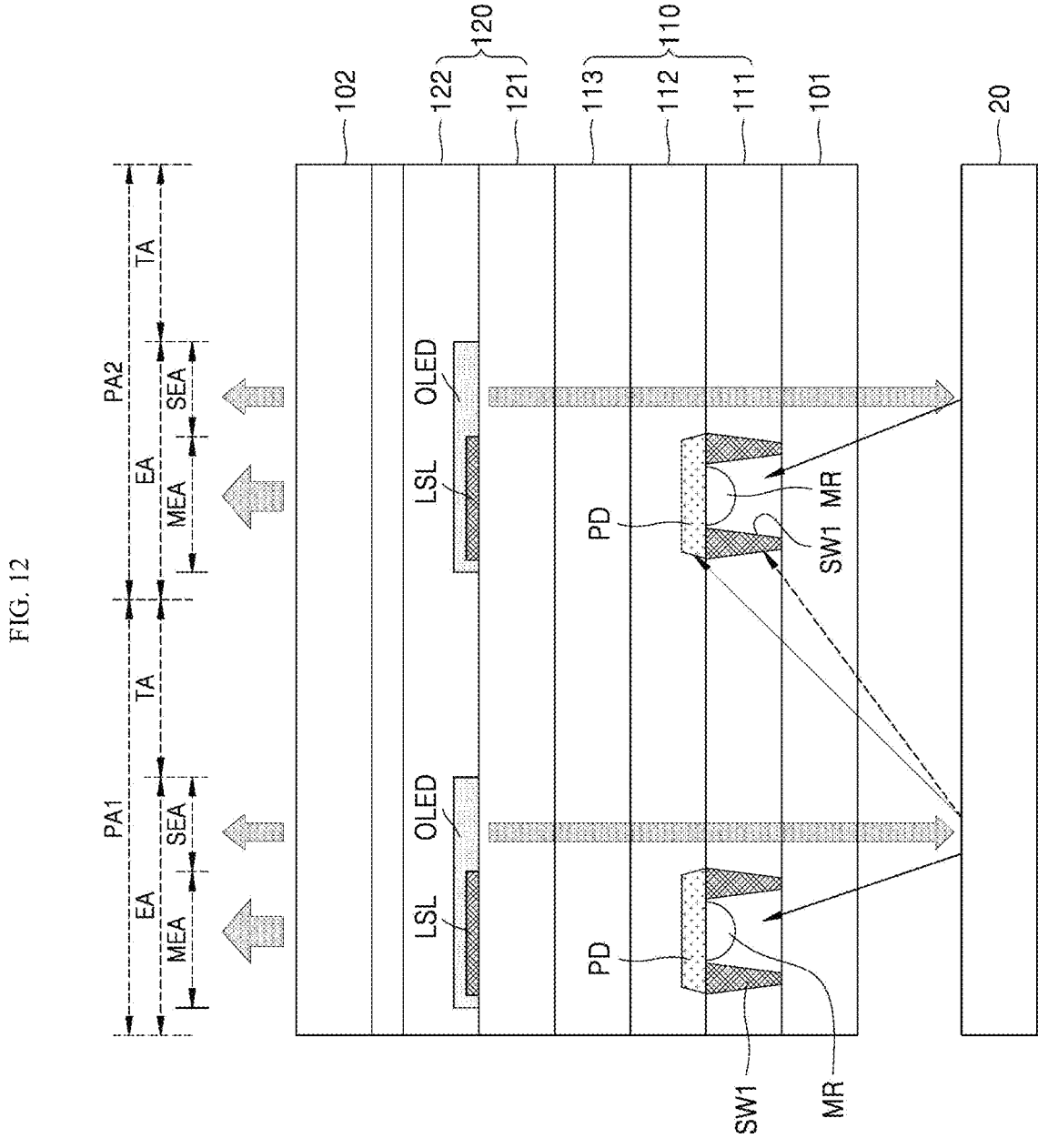
FIG. 12 is a view showing an example of light paths of any two adjacent pixel areas of a flat panel in a first embodiment.

FIG. 6 is a view showing a flat panel in FIGS. 1 and 2. FIG. 7 is a view showing a portion of the flat panel in FIG. 6. FIG. 8 is a view showing portion A of FIG. 7 in one embodiment. FIG. 9 is a view showing a cross section along I-I' of FIG. 8. FIG. 10 is a view showing portion B of FIG. 9. FIG. 11 is a view showing portion C of FIG. 9. FIG. 12 is a view showing an example of a light path of each of the adjacent pixel areas among the pixel areas in FIG. 7.

As illustrated in FIG. 6, a flat panel 100 in a first embodiment includes first and second support boards 101, 102 that face each other, and a sensing array 110 and a light emitting array 120 that are disposed between the first and second support boards 101, 102.

The first and second support boards 101, 102 adhere using a predetermined adhesive material (not illustrated) in a state of facing each other.

Each of the first and second support boards 101, 102 is made of a transparent insulating material. In an example, each of the first and second support boards 101, 102 may be made of glass. In another example, each of the first and second support boards 101, 102 may be made of a soft transparent insulating material such as plastics and the like.

The sensing array 110 includes a plurality of light sensing elements PD corresponding to the light sensing area SA of each of the plurality of pixel areas PA.

The light emitting array 120 includes a plurality of light emitting elements OLED corresponding to the light emitting area EA of each of the plurality of pixel areas PA.

As illustrated in FIG. 7, the flat panel 100 includes a plurality of pixel areas PA that is arranged in a matrix form in the active area in which scanning operation is performed.

Each of the plurality of pixel areas PA includes a light emitting area EA that emits light, a light transmitting area TA that is adjacent to the light emitting area EA and transmits light, and a light sensing area SA that constitutes a portion of the light emitting area EA and senses light.

In a flat panel 100 that provides the function of displaying a color image, the light emitting area EA of each pixel area PA may emit light corresponding to any one of a plurality of basic colors. The plurality of basic colors may include red, green, blue and white.

In an example, the light emitting areas EA1, EA2, EA3, EA4 of four mutually adjacent pixel areas PA may emit light corresponding to red, green, blue and white, as illustrated in FIG. 7. In this case, the four light emitting areas EA1, EA2, EA3, EA4 that are mutually adjacent and emit light of different basic colors may be determined as a unit pixel UP that displays different colors.

FIG. 7 shows the light emitting areas EA of the pixel areas PA, arranged horizontally (the left-right direction in FIG. 7) in parallel with one another, emit light corresponding to the same color, for example. However, as long as a unit pixel UP displaying various colors based on a combination of light corresponding to the plurality of basic colors is implemented, a method by which a basic color is determined for the light emitting areas EA may vary in different ways.

As illustrated in FIG. 8, the flat panel EM1 in the first embodiment includes a light emitting element OLED corresponding to the light emitting area EA of each pixel area PA, and a light sensing element PD corresponding to the light sensing area SA of each pixel area PA.

The light transmitting area TA of each pixel area PA does not correspond to any one of the light emitting element OLED and the light sensing element PD. Accordingly, the light transmitting area TA transmits larger amounts of light than the light emitting area EA does. Since light passes through the light transmitting area TA, the flat panel 100 may exhibit transparency.

That is, since a portion of each of the plurality of pixel areas PA consists of the light transmitting area TA, an object under the flat panel 100 can be recognized by the user, and the user is aware that the flat panel 100 is transparent.

Under the assumption that the scanning device 10 generates a digital image signal corresponding to the object to be scanned (20 in FIG. 1) under the flat panel 100, the light sensing element PD of the flat panel 100 may be disposed closer to the object to be scanned 20 than the light emitting element OLED. That is, the light sensing element PD may be disposed under the light emitting element OLED. By doing so, a loss of light reflected from the object to be scanned 20 may decrease in a path to the light sensing element PD.

The light emitting-driving circuit T1, T2 for driving the light emitting element OLED corresponds to a portion of the light emitting area EA.

Electrode patterns constituting the light emitting-driving circuit T1, T2 may be made of a material that blocks or reflects light, and to minimize a decrease in luminance, caused by the light emitting-driving circuit T1, T2, the light emitting-driving circuit T1, T2 may be disposed under the light emitting element OLED. That is, the light emitting-driving circuit T1, T2 may be disposed between the light emitting element OLED and the light sensing element PD.

As illustrated in FIG. 5, both ends of the light sensing element PD connect to the read-out circuit (RT in FIG. 5) and the bias line (BL in FIG. 5).

As illustrated in FIG. 8, the read-out transistor RT of the read-out circuit, connected to one end of the light sensing element PD corresponds to a portion of the light emitting area EA, and overlaps a portion of the light emitting-driving circuit T1, T2.

The read-out transistor RT may be disposed under the light sensing element PD.

Though not illustrated in FIG. 8, the bias line BL providing a bias voltage to the light sensing element PD may be arranged to cross the light sensing areas SA of the horizontally or perpendicularly continuous pixel areas PA.

The bias line BL may be disposed on/over the light sensing element PD. That is, the bias line BL may be disposed between the light sensing element PD and the light emitting-driving circuit T1, T2.

The flat panel 100 may further include a first light shielding wall SW1 corresponding to the edge of the light sensing area SA.

The flat panel 100 further includes a micro lens (MR in FIG. 9) that is disposed under the light sensing element PD and surrounded by the first light shielding wall SW1.

The micro lens MR concentrates light reflected from an object to be scanned 20 on the light sensing element PD. With the micro lens MR, a ratio at which the light reflected from the object to be scanned 20 is incident to the light sensing element PD may increase.

The first light shielding wall SW1 blocks light, not reflected from the object to be scanned 20, from being input to the micro lens MR and the light sensing element PD. With the first light shielding wall SW1, the light sensing element PD may generate a detection signal Rdata, based on the light reflected from the object to be scanned 20. In other words, the effect of light incident from the light emitting element OLED directly to the micro lens MR and the light sensing element PD, light incident to the micro lens MR and the light sensing element PD through the light transmitting area TA, and the like may decrease on the generation of a detection signal Rdata.

Thus, with the micro lens MR and the first light shielding wall SW1, the accuracy of a detection signal generated by the light sensing element PD may increase.

Further, the flat panel 100 includes signal lines GL, SL, DL, ROL arranged around the plurality of pixel areas PA.

In an example, the gate line GL and the scan line SL may be disposed horizontally, while the data line DL and the read-out line ROL may be disposed perpendicularly.

FIG. 8 shows that the gate line GL and the scan line SL are spaced from each other, and the data line DL and the read-out line ROL are spaced from each other, to intuitively illustrate each component.

Unlike the gate line GL and the scan line SL, and the data line DL and the read-out line ROL in FIG. 8, the gate line GL and the scan line SL may overlap each other at least partially, and the data line DL and the read-out line ROL may overlap each other at least partially, within the scope in which a signal distortion is prevented.

Specifically, the gate lien GL and the data line DL are disposed between the light emitting element OLED and the light sensing element PD, together with the light emitting-driving circuit T1, T2, and the scan line SL and the read-out line ROL are disposed under the light sensing element PD, together with the read-out transistor RT.

As described above, the gate line GL and the scan line SL are disposed in different layers while being disposed in the same direction. Accordingly, the gate line GL and the scan line SL may overlap each other at least partially. Likewise, the data line DL and the read-out line ROL are disposed in different layers while being disposed in the same direction. Accordingly, the data line DL and the read-out line ROL may overlap each other at least partially. This leads to the effective integration of the pixel areas PA, ensuring improvement in resolution.

As illustrated in FIG. 9, the flat panel EM1 in the first embodiment includes a first support board 101, a sensing array 110 disposed on the first support board 101 and including the light sensing element PD corresponding to the light sensing area SA of each of the plurality of pixel areas PA, a micro lens MR disposed between the first support board 101 and the light sensing element PD, a light emitting array 120 disposed on the sensing array 110 and including the light emitting element OLED corresponding to the light emitting area EA of each of the plurality of pixel areas PA, and a second support board 102 disposed on the light emitting array 120 and facing the first support board 101.

If the flat panel EM1 provides the function of displaying a color image, the flat panel EM1 may further include a color filter CF that is disposed on one surface of the second support board 102, faces a fifth protective film 122 and corresponds to the light emitting area EA of each pixel area PA. The color filter CF transmits light rays in a range of wavelengths of the basic colors corresponding to the light emitting area EA of each pixel area PA among light rays of the light emitting element OLED.

The sensing array 110 includes a read-out circuit RT disposed on the first support board 101 and corresponding to each of the plurality of pixel areas PA, a first protective film 111 disposed on the first support board 101 and covering the read-out circuit RT, a light sensing element PD disposed on the first protective film 111 and corresponding to the light sensing area SA of each of the plurality of pixel areas PA, a second protective film 112 disposed on the first protective film 11 and covering the light sensing element PD, a bias line BL disposed on the second protective film 112, and a third protective film 113 disposed on the second protective film 112 and covering the bias line BL.

The micro lens MR is concavely disposed on the first protective film 111 and faces a pixel electrode 311. That is, the pixel electrode 311 is disposed on the first protective film 111 and the micro lens MR and overlaps the micro lens MR.

In an example, the micro lens MR may be provided through the processes of patterning the first protective film 111, disposing a concave part on the first protective film 111 and then filling the concave part of the first protective film 111 with an insulating material.

To prevent a loss of light reflected from an object to be scanned 20 on the boundary between the first protective film 111 and the micro lens MR, caused due to total reflection, the micro lens MR is made of a material having a refractive index higher than that of the first protective film 111.

Additionally, to prevent a loss of light reflected from an object to be scanned 20 on the boundary between the first support board 101 and the first protective film 111, caused due to total reflection, the first protective film 111 is made of a material having a refractive index higher than that of the first support board 101.

The first light shielding wall SW1 passes through the first protective film 111. Thus, the lower portion of the first light shielding wall SW1 may contact the first support board 101, and the upper portion of the first light shielding wall SW1 may contact at least a portion of the pixel electrode 311 of the light sensing element PD.

Since the micro lens MR is surrounded by the first light shielding wall SW1, light incident to the micro lens MR is limited to light that passes through the first support board 101 and the first protective film 111 in the light sensing area SA of each pixel area PA.

That is, the first light shielding wall SW1 may block a path in which light generated in an adjacent pixel area is incident to the micro lens MR through the light transmitting area TA of each pixel area PA.

Thus, the accuracy of a detection signal generated by the light sensing element PD may improve.

In an example, the first light shielding wall SW1 may be provided through the processes of forming a hole that passes through the first protective film 111 and then filling the hole of the first protective film 111 with an insulating light shielding material.

In another example, the first light shielding wall SW1 may be provided through the processes of patterning a light shielding material on the first support board 101 in the form of a frame that surrounds the perimeter of the light sensing area SA before disposing the first protective film 111, disposing the first protective film 111 and then removing the light shielding material that protrudes upward from the first protective film 111.

In yet another example, the first light shielding wall SW1 may be provided through the processes of patterning a molding material on the first support board 101 in the form of a frame that surrounds the perimeter of the light sensing area SA and removing a portion of a light shielding material disposed on the patterned molding material, which does not cover the molding material. Additionally, the first protective film 111 has a thickness to the extent that the first protective film 111 does not cover the first light shielding wall SW1.

Since the first light shielding wall SW1 contacts the pixel electrode 311 of the light sensing element PD, the first light shielding wall SW1 may be made of an insulating light shielding material. Alternatively, the first light shielding wall SW1 may be made of an insulating and light absorbing material.

As illustrated in FIG. 10, the read-out transistor RT of the read-out circuit may include a first active layer 411 disposed on the first support board 101, a first gate insulating layer 412 disposed on a channel area of the first active layer 411, a first gate electrode 413 disposed on the first gate insulating layer 412, a first interlayer insulating film 420 covering the first active layer 411 and the first gate electrode 413, and a first source electrode 414 and a first drain electrode 415 disposed on the first interlayer insulating film 420.

Referring to FIG. 5, the first gate electrode 413 may connect to the scan line SL, the first source electrode 414 may connect to the read-out line ROL, and the first drain electrode 415 may connect to the light sensing element PD.

FIG. 10 shows that the read-out transistor RT is a top gate structure, for example. However, the read-out transistor RT can be implemented as a bottom gate structure, a double gate structure and the like.

The light sensing element PD includes a pixel electrode 311 and a bias electrode 312 that face each other, and a PIN layer 313 that is disposed between the pixel electrode 311 and the bias electrode 312.

The pixel electrode 311 is disposed on the first protective film 111. The pixel electrode 311 connects to the read-out transistor RT of the read-out circuit through a first contact hole CT1 that passes through the first protective film 111.

The pixel electrode 311 overlaps the micro lens MR. Accordingly, light converged by the micro lens MR may be input to the pixel electrode 311.

Additionally, the pixel electrode 311 may overlap at least a portion of the first light shielding wall SW1 that surrounds the micro lens MR. Alternatively, the first light shielding wall SW1 may be disposed to surround the edge of the pixel electrode 311.

The PIN layer 313 is disposed on the pixel electrode 311, and has a structure in which a P-type semiconductor layer, an I-type semiconductor layer and an N-type semiconductor layer are joined.

The bias electrode 312 is disposed on the PIN layer 313. The bias electrode 312 connects to the bias line BL on the second protective film 112 through a bias contact hole that passes through the second protective film 112.

When light is input to the light sensing element PD, an electron-hole pair is generated in the PIN layer 13 having reacted to light, and based on a bias power source Vbias supplied to the bias electrode 312, the electron of the electron-hole pair moves. Thus, a detection signal Rdata corresponding to an amount of the light incident to the light sensing element PD is generated.

Referring back to FIG. 9, the light emitting array 120 is disposed on the third protective film 113 of the sensing array 110.

The light emitting array 120 includes light emitting-driving circuits T1, T2 disposed on the third protective film 113 and corresponding to each of the plurality of pixel areas PA, a fourth protective film 121 disposed on the third protective film 113 and covering the light emitting-driving circuit T1, T2, a light emitting element (OLED) disposed on the fourth protective film 121 and corresponding to the light emitting area EA of each of the plurality of pixel areas PA, and a fifth protective film 122 disposed on the fourth protective film 121 and covering the light emitting element OLED.

As illustrated in FIG. 11, the first transistor T1 of the light emitting-driving circuits T1, T2 may include a second active layer 431 disposed on the third protective film 113, a second gate insulating layer 432 disposed on the channel area of the second active layer 431, a second gate electrode 433 disposed on the second gate insulating layer 432, a second interlayer insulating film 440 covering the second active layer 431 and the second gate electrode 433, and a second source electrode 434 and a second drain electrode 435 disposed on the second interlayer insulating film 440.

Likewise, the second transistor T2 may include a third active layer 451 disposed on the third protective film 113, a third gate insulating layer 452 disposed on the channel area of the third active layer 451, a third gate electrode 453 disposed on the third gate insulating layer 452, a second interlayer insulating film 440 covering the first active layer 451 and the third gate electrode 453, and a third source electrode 454 and a third drain electrode 455 disposed on the second interlayer insulating film 440.

Referring to FIG. 4, the second gate electrode 433 of the first transistor T1 may connect to the gate line GL, the second source electrode 434 may connect to the data line DL, and the second drain electrode 435 may connect to the third gate electrode 452 of the second transistor T2.

Additionally, the third source electrode 454 of the second transistor T2 may connect to the first driving power source line VDDL, and the third drain electrode 455 may connect to the light emitting element OLED, for example.

However, depending on the structure of the element, the connection point of the source electrode may be exchanged with the connection point of the drain electrode.

FIG. 11 shows that the first and second transistors T1, T2 are a top gate structure, for example. Certainly, the first and second transistors T1, T2 may also be implemented as a bottom gate structure, a double gate structure, and the like.

Hereafter, FIG. 9 is described again.

The light emitting element OLED includes a first electrode 321 and a second electrode 322 that face each other, and a light emitting layer 323 that is disposed between the first electrode 321 and second electrode 322.

The first electrode 321 is disposed on the fourth protective film 121 and corresponds to the light emitting area EA of each of the plurality of pixel areas PA. The first electrode 321 connects to the second transistor T2 of the light emitting-driving circuit through a second contact hole CT2 that passes through the fourth protective film 121.

Since the first electrode 321 corresponds to the light emitting area EA, a portion of the first electrode 321, corresponding to a main light emitting area MEA, is disposed on a light shielding-reflecting layer LSL, and the remaining portion is disposed on the fourth protective film 121.

The light emitting layer 323 is disposed on the fourth protective film 121 and covers a plurality of first electrodes 321 corresponding to the plurality of pixel areas PA.

Though not illustrated in FIG. 9, in a light emitting array 120 that further includes a bank (not illustrated) disposed on the fourth protective film 121 and covering the edge of the first electrode 321, the light emitting layer 323 further covers the bank (not illustrated).

The second electrode 322 is disposed on the light emitting layer 323 and corresponds to the plurality of pixel areas PA.

In an example, the light emitting layer 323 and the second electrode 322 may be formed in a single pattern.

The first and second electrodes 321, 322 may be made of a transparent conductive material or a semitransparent conductive material respectively.

Accordingly, the light emitting layer 323's light may be emitted to both sides through the first and second electrodes 321, 322.

However, the light emitting element OLED's light needs to be emitted to the first support board 101 to perform the scanning operation as well as the second support board 102 to display an image.

To this end, in one embodiment, the light emitting array 120 further includes a light shielding-reflecting layer disposed below the light emitting element OLED and corresponding to a portion of the light emitting area EA.

The light shielding-reflecting layer LSL is disposed between the fourth protective film 121 and the light emitting element OLED, i.e., between the fourth protective film 121 and the first electrode 321, and corresponds to the main light emitting area MEA that is a portion of the light emitting area EA.

The light shielding-reflecting layer LSL reflects the light emitting element OLED's light to the second support board 102 and blocks the light emitting element OLED's light from moving to the first support board 101.

Since the light emitting array 120 includes the light shielding-reflecting layer LSL as described above, the light emitting area EA of each pixel area PA includes a main light emitting area MEA that emits light to one side, i.e., toward the second support board 102, and a sub light emitting area SEA that emits light to both sides, i.e., toward the first support board 101 and the second support board 102.

Additionally, the light shielding-reflecting layer LSL overlaps the read-out circuit RT, the light sensing element PD, and the light emitting-driving circuits T1, T2. That is, the read-out circuit RT, the light sensing element PD, and the light emitting-driving circuits T1, T2 are disposed in the main light emitting area MEA corresponding to the light shielding-reflecting layer LSL.

Thus, the read-out circuit RT, the light sensing element PD, and the light emitting-driving circuits T1, T2 are not recognized by the user facing the second support board 102, thereby preventing deterioration in display quality.

Further, since the light shielding-reflecting layer LSL is disposed between the light sensing element PD and the light emitting element OLED, the light emitting element OLED's light is not directly input to the bias electrode 312 of the light sensing element PD.

As illustrated in FIG. 12, the light emitting element OLED's light corresponding to the light emitting area EA is emitted to one side, i.e., toward the second support board 102, in the main light emitting area MEA corresponding to the light shielding-reflecting layer LSL. Additionally, the light emitting element OLED's light corresponding to the light emitting area EA is emitted to both sides, i.e., toward the first support board 101 and the second support board 102, through the first and second electrodes 321, 322, in the sub light emitting area SEA in which the light shielding-reflecting layer LSL is not disposed.

A portion of the light emitting element OLED's light, emitted toward the first support board 101, is reflected from an object to be scanned 20 disposed below the first support board 101.

In this case, the fourth protective film 121, the third protective film 113, and the second protective film 112 and the first protective film 111 are made of a material that has a higher refractive index in the order of the fourth protective film 121, the third protective film 113, and the second protective film 112 and the first protective film 111, such that a portion of the light emitting element OLED's light, emitted toward the first support board 101, is prevented from being lost due to total reflection on the boundaries among the fourth protective film 121, the third protective film 113, and the second protective film 112 and the first protective film 111 until the portion reaches an object to be scanned 20.

That is, the third protective film 113 has a higher refractive index than the fourth protective film 121, the second protective film 112 has a higher refractive index than the third protective film 113, and the first protective film 111 has a higher refractive index than the second protective film 112.

The light sensing element PD generates a detection signal Rdata corresponding to an amount of light reflected from the object to be scanned 20 and input through the micro lens MR.

The micro lens MR converges the light reflected from the object to be scanned 20 and delivers the converged light to the light sensing element PD, resulting an increase in the amount of the light input to the light sensing element PD.

Because of the first light shielding wall SW1 of each pixel area PA, light incident to the micro lens MR of each pixel area PA may correspond to the light sensing area SA of each pixel area PA and be limited to light reflected from an object to be scanned 20.

Additionally, the light shielding-reflecting layer LSL disposed between the light sensing element PD and the light emitting element OLED may prevent the light emitting element OLED's light from being input to the light sensing element PD through the bias electrode 312 of the light sensing element PD.

Since the flat panel EM1 in the first embodiment includes the light shielding-reflecting layer LSL, the micro lens MR and the first light shielding wall SW1 as described above, the accuracy of a detection signal Rdata generated in the light sensing element PD may improve. Thus, consistency between a digital image signal generated by the scanning device 100 and an object to be scanned 20 may improve.

As illustrated in FIG. 12, a portion of light generated in any one pixel area PA1 may be input to the light sensing element PD of an adjacent pixel area PA2 through the light transmitting area TA of each pixel area PA1, PA2. Thus, improvement in the accuracy of a detection signal Rdata generated by the light sensing element PD is limited.

Figure 13:
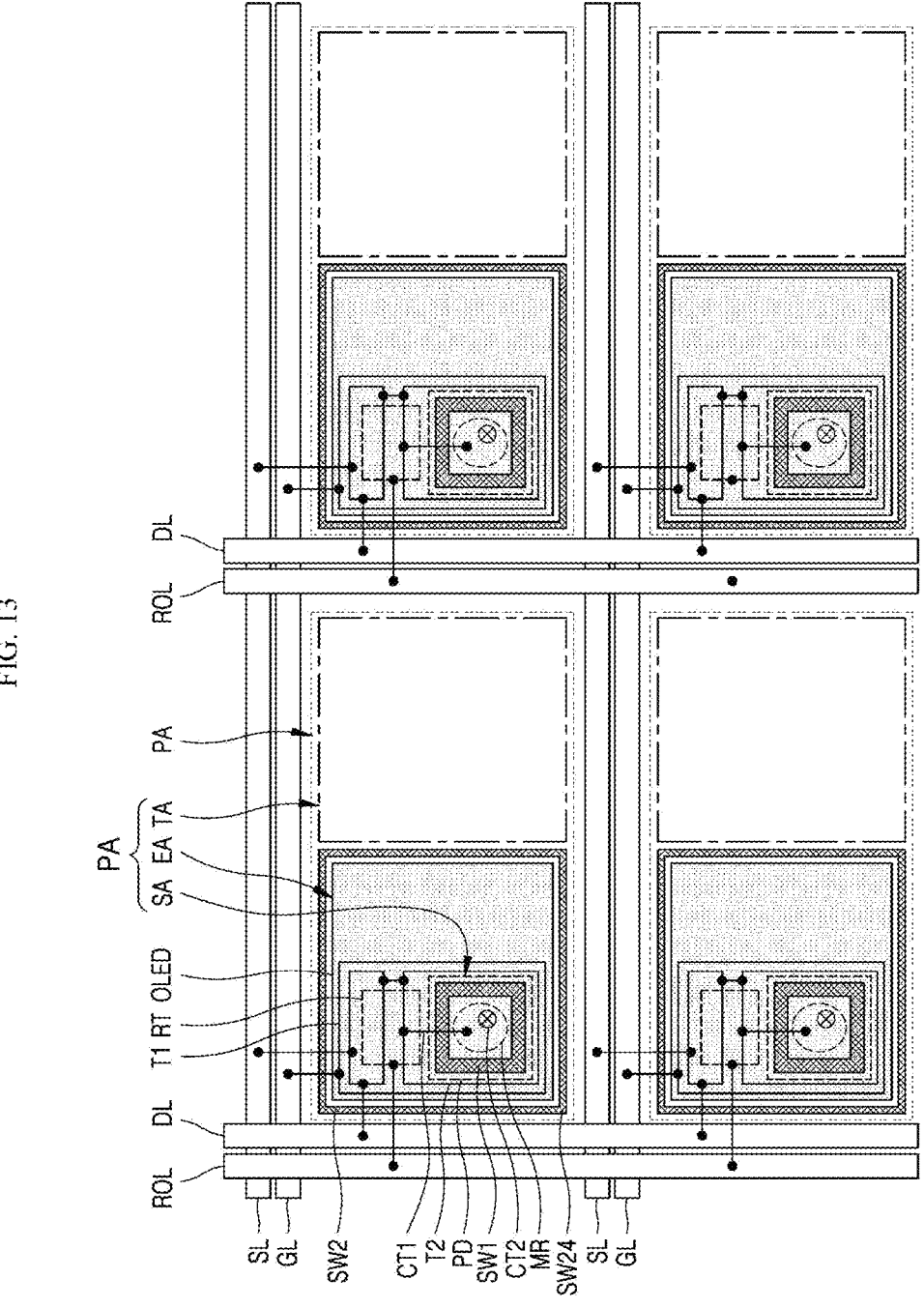
FIG. 13 is a view showing portion A of FIG. 7 in a second embodiment.
Figure 14:
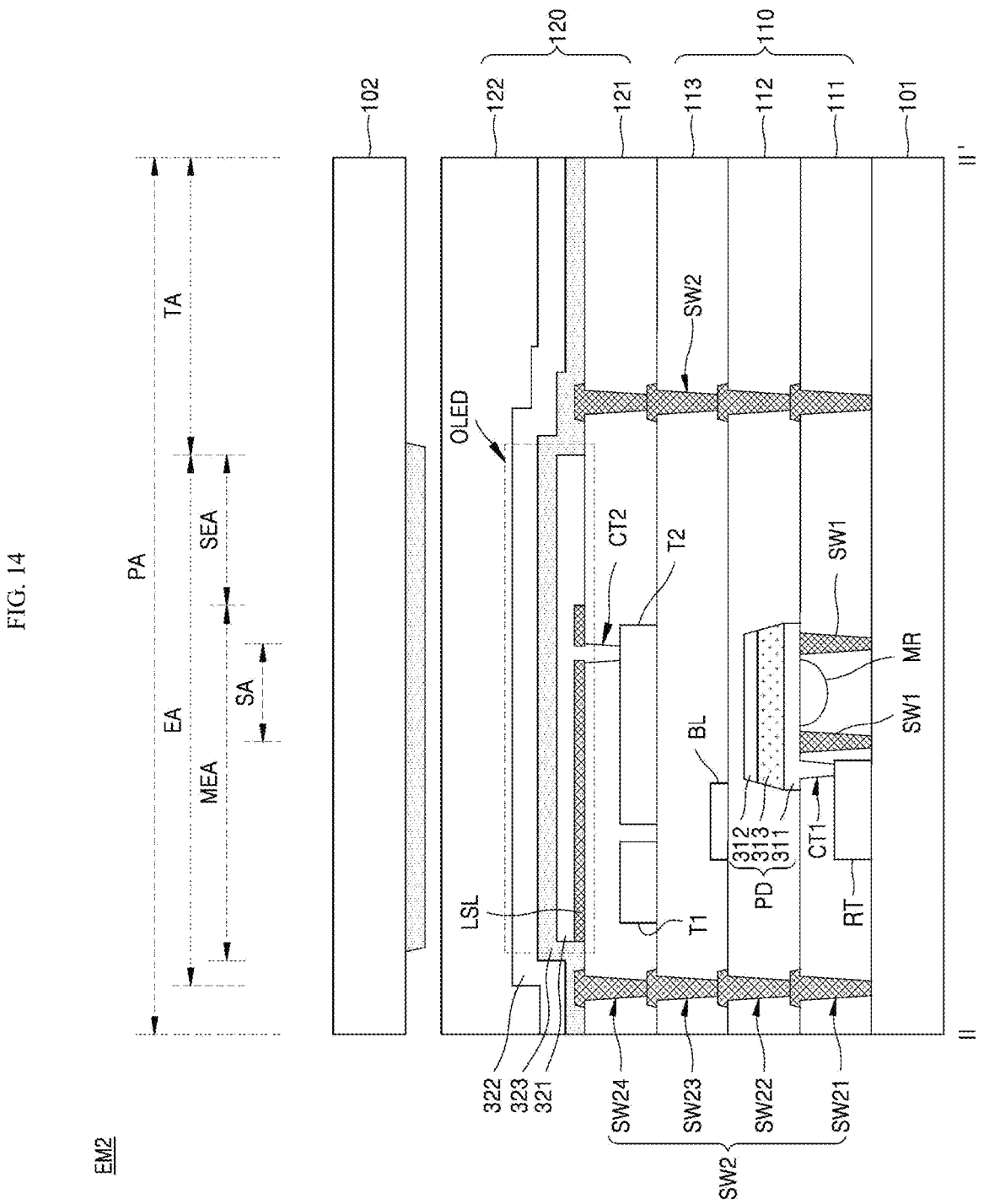
FIG. 14 is a view showing a cross section along II-II' of FIG. 13.

To solve the problem, a second embodiment is provided. FIG. 13 is a view showing portion A of FIG. 7 in a second embodiment. FIG. 14 is a view showing a cross section along II-II' of FIG. 13. FIGS. 15 to 18 are views showing an example of a flat surface shape of single layer patterns included in a second light shielding wall in FIG. 14. FIG. 19 is a view showing an example of light paths of any two adjacent pixel areas of a flat panel in the second embodiment.

As illustrated in FIG. 13 and FIG. 14, the flat panel EM2 in the second embodiment is the same as that EM1 in the first embodiment except that the flat panel EM2 in the second embodiment further includes a second light shielding wall SW2 surrounding the light emitting area EA of each of the plurality of pixel areas PA. Hereafter, a repetition of description is avoided.

As illustrated in FIG. 14, the second light shielding wall SW2 is disposed on the first support board 101, and passes through the first protective film 111, the second protective film 112, the third protective film 113 and the fourth protective film 121 respectively.

The second light shielding wall SW2 consists of single-layer patterns (SW21, SW22, SW23, SW24) that passes through the first protective film 111, the second protective film 112, the third protective film 113 and the fourth protective film 121 respectively and overlaps one another.

As illustrated in FIG. 13, the second light shielding wall SW2 consisting of the single-layer patterns SW21, SW22, SW23, SW24 overlapping one another has a closed shape.

However, at least one of the single-layer patterns SW21, SW22, SW23, SW24 may have an open shape in which at least one of the single-layer patterns SW21, SW22, SW23, SW24 is spaced from a signal line.

Figure 15:
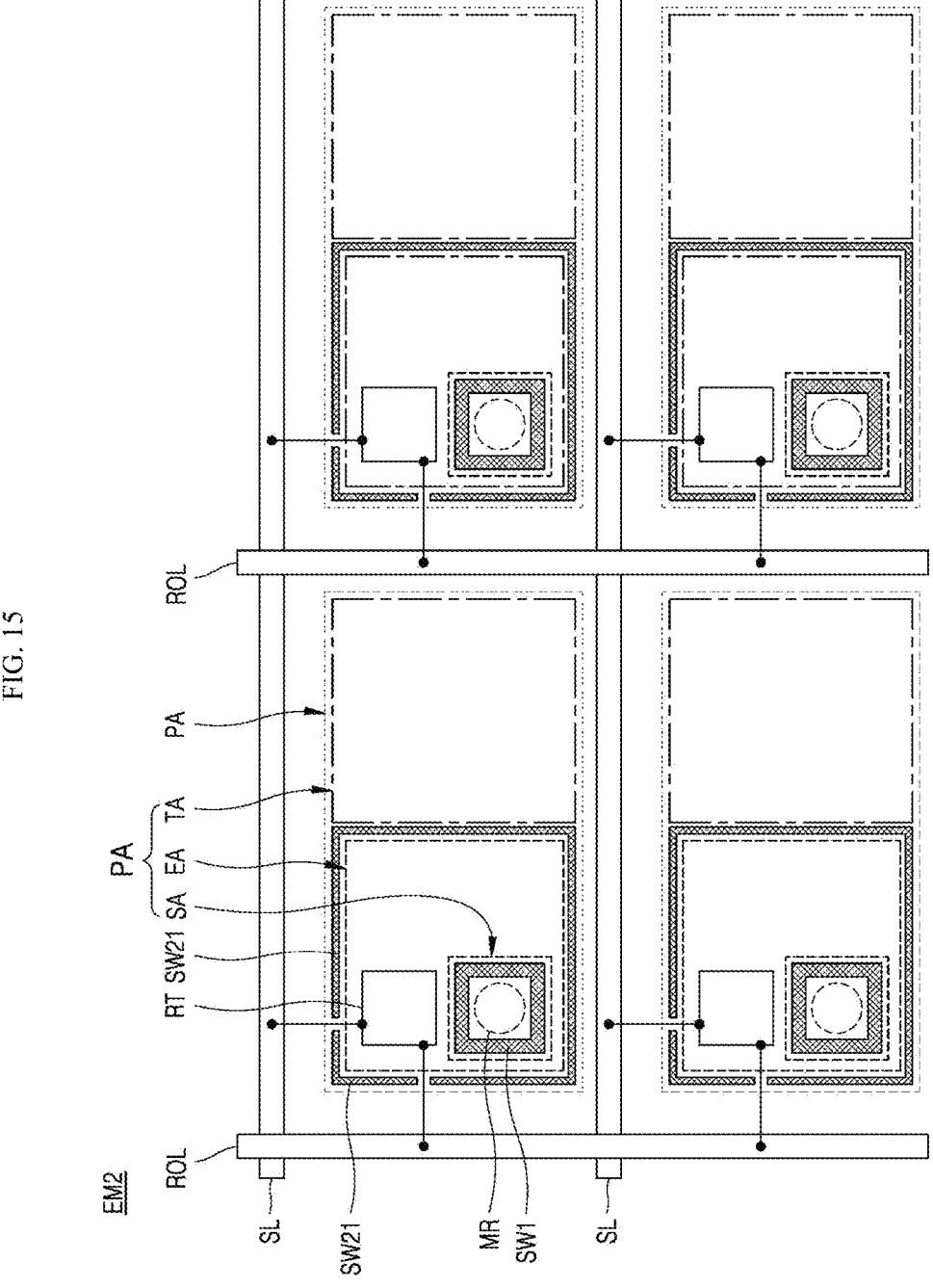
FIGS. 15 to 18 are views showing an example of a plan view of single-layer patterns included in a second light shielding wall in FIG. 14.

In an example, as illustrated in FIGS. 14 and 15, the scan line SL, the read-out line ROL and the read-out circuit RT are disposed on the first support board 101. Since a first single-layer pattern SW21 on the first support board 101 is disposed in a way that passes through the first protective film 111 on the first support board 101, the first single-layer pattern SW21 crosses the connection portion among the scan line SL, each of the read-out lines ROL, and the read-out circuit RT.

In this case, since a portion of the first single-layer pattern SW21, crossing the connection portion among the scan line SL, each of the read-out lines ROL, and the read-out circuit RT, is removed, the first single-layer pattern SW21 has an open shape.

Figure 16:
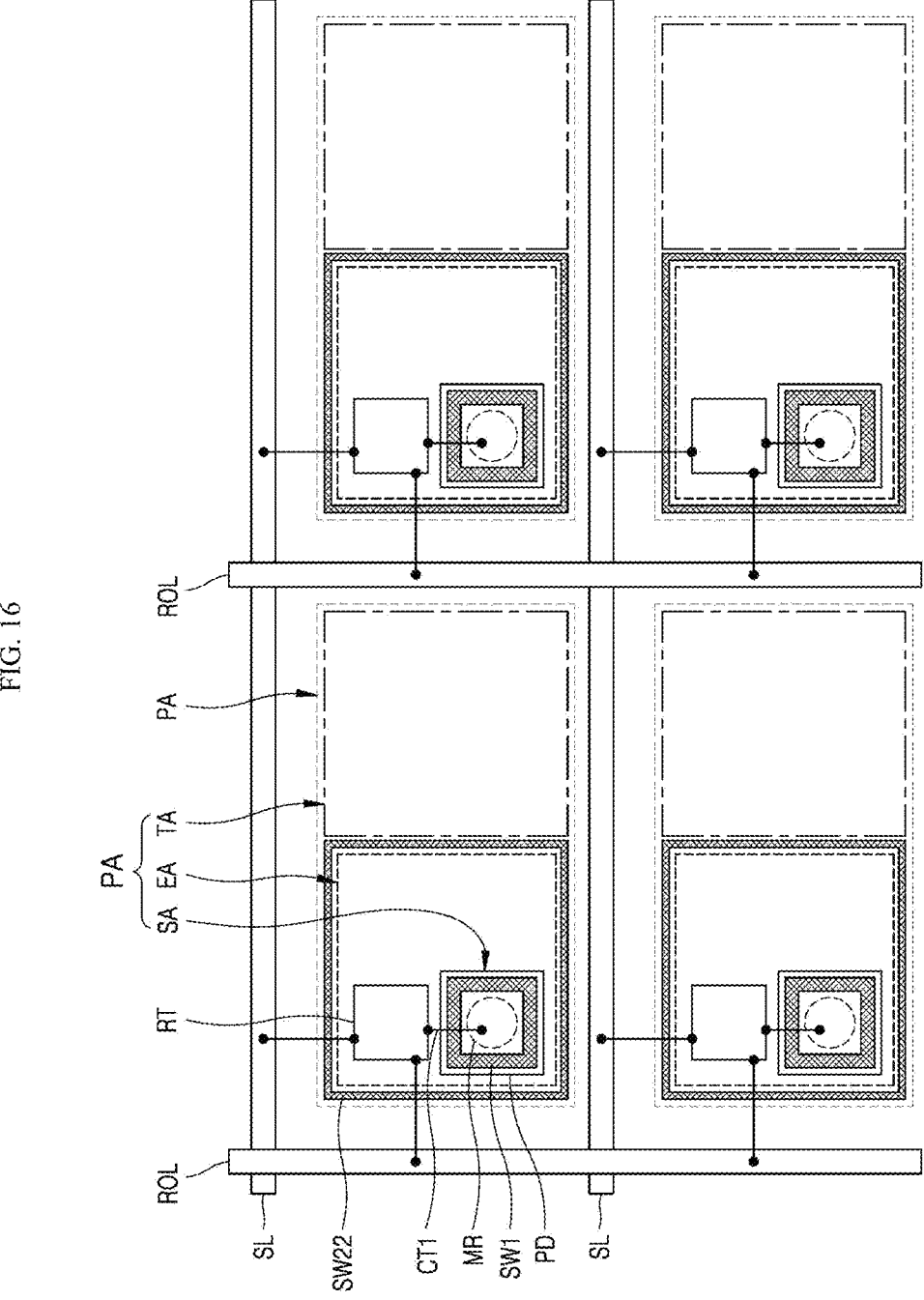

As illustrated in FIGS. 14 and 16, the light sensing element PD corresponding to the light sensing area SA of each pixel area PA is disposed on the first protective film 111. That is, a signal wire is not disposed on the first protective film 111.

A second single-layer pattern SW22 on the first protective film 111 is disposed in a way that passes through the second protective film 112 on the first protective film 111. Since the second single-layer pattern SW22 includes no portion in which the second single-layer pattern SW22 crosses a signal line disposed on the same layer, the second single-layer pattern SW22 has a closed shape.

Figure 17:
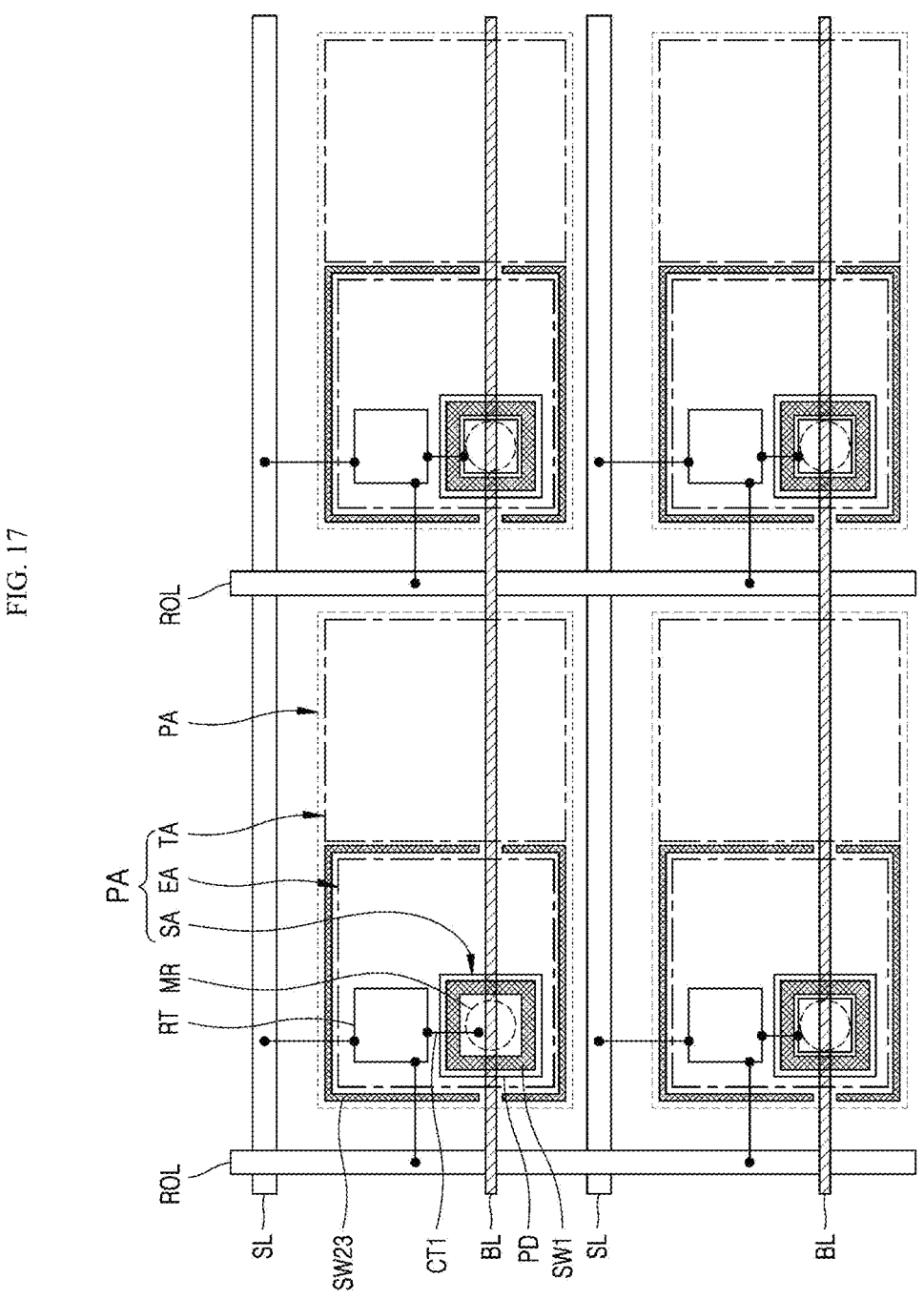

As illustrated in FIGS. 14 and 17, the bias line BL is disposed on the second protective film 112 covering the light sensing element PD. A third single-layer pattern SW23 on the second protective film 112 is disposed in a way that passes through the third protective film 113 on the second protective film 112, and crosses the bias line BL.

In this case, since a portion of the third single-layer pattern SW23, crossing the bias line BL, is removed, and the third signal-layer pattern SW23 has an open shape.

Figure 18:
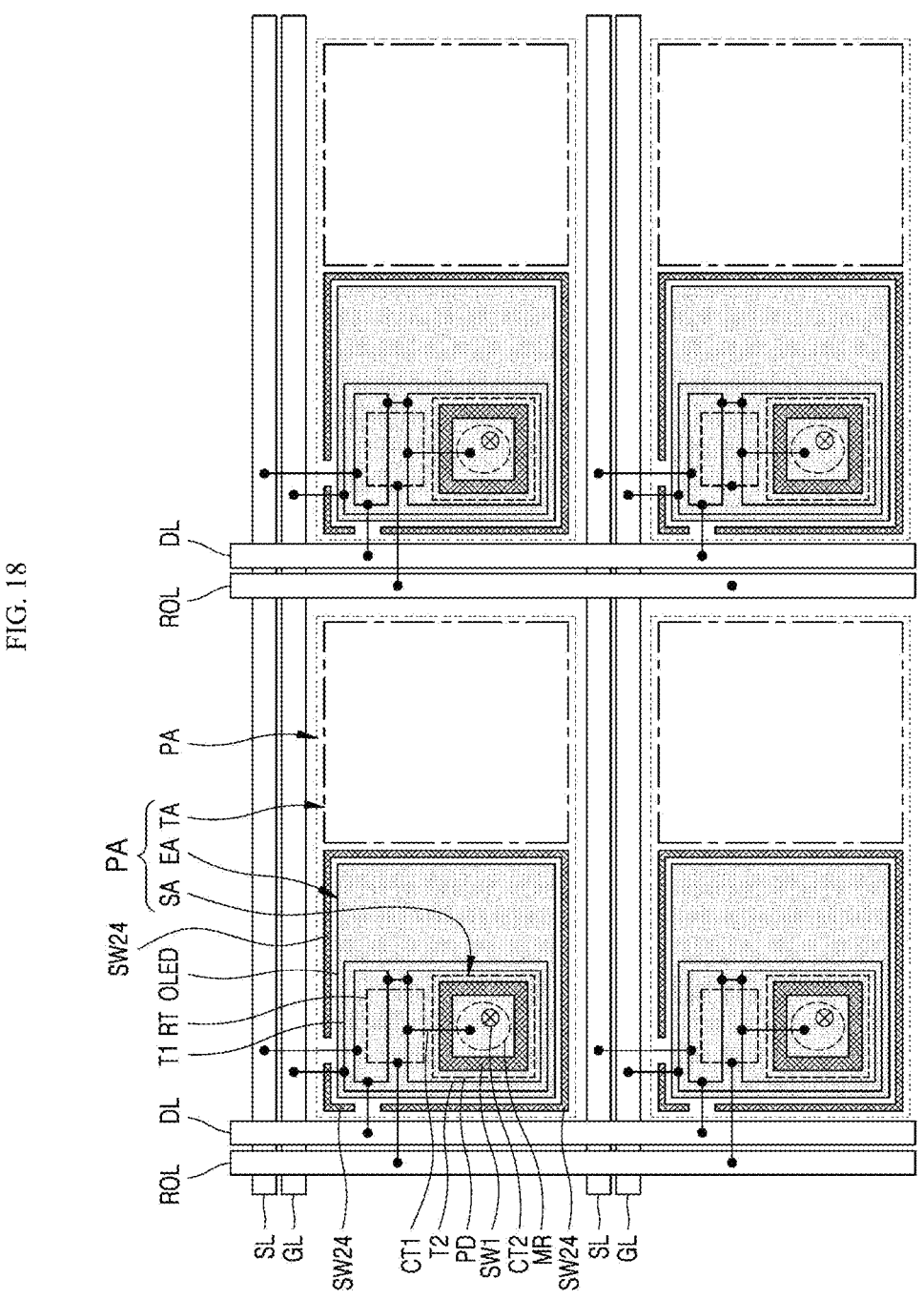
Figure 19:
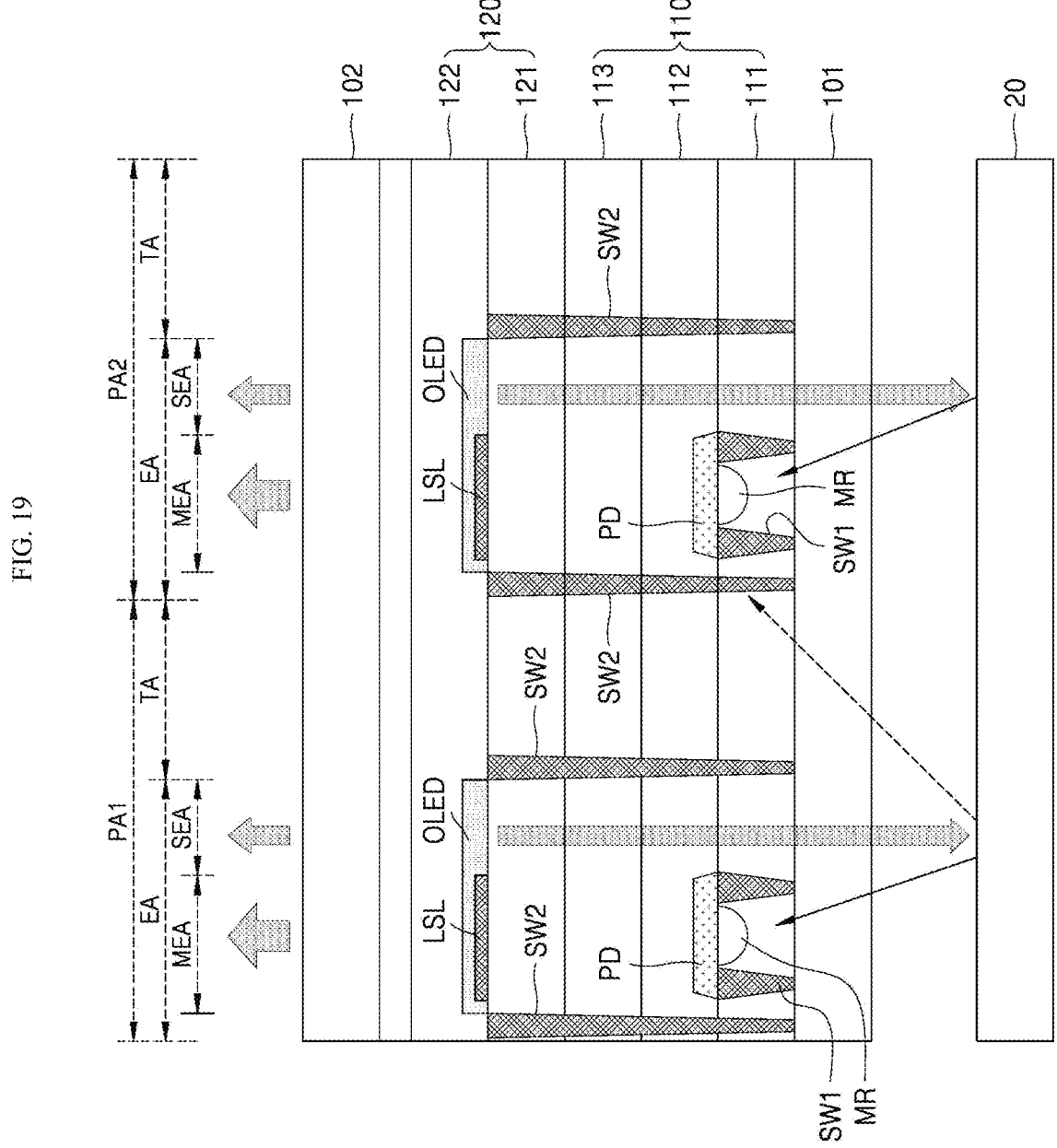
FIG. 19 is a view showing an example of light paths of any two adjacent pixel areas of a flat panel in the second embodiment.

As illustrated in FIGS. 14 and 18, the light emitting-driving circuits T1, T2, the gate line GL and the data line DL are disposed on the third protective film 113 covering the bias line BL. A fourth single-layer pattern SW24 on the third protective film 113 is disposed in a way that passes through the fourth protective film 121 on the third protective film 113, and crosses the connection portion between each of the gate line GL and the data line DL and the light emitting-driving circuit T1, T2.

Thus, a portion of the fourth single-layer pattern SW24, crossing the connection portion between each of the gate line GL and the data line DL and the light emitting-driving circuit T1, T2, is removed, and the fourth single-layer pattern SW24 has an open shape.

The second light shielding wall SW2 in which the first, second, third and fourth single-layer patterns SW21, SW22, SW23, SW24 overlap one another may be insulated from the read-out circuit RT, the scan line SL, the read-out line ROL, the bias line BL, the light emitting-driving circuit T1, T, the gate line GL and the data line DL respectively. Thus, signal distortion or short caused by the second light shielding wall SW2 may be prevented.

The second light shielding wall SW2 blocks a path in which an adjacent pixel area PA's light is incident to the light sensing element PD.

That is, as illustrated in FIG. 19, the second light shielding wall SW2, surrounding the light emitting area EA of each pixel area PA, may block the delivery of light through the light transmitting area TA of each pixel area PA.

This means that even if light generated in any one pixel area PA1 is emitted toward an adjacent pixel area PA2 through at least one of the first transparent support board 101 made of transparent insulating material, the first protective film 111, the second protective film 112, the third protective film 113 and the fourth protective film 121, the light may be blocked by the second light shielding wall SW2.

Accordingly, the light sensing element PD of each pixel area PA2 may generate a detection signal Rdata in a state in which the light sensing element PD is not affected by light generated in an adjacent pixel area PA1. As a result, the accuracy of a detection signal Rdata generated in the light sensing element PD may improve further, and consistency between a digital image signal generated by the scanning device 100 and an object to be scanned 20 may improve further.

Further, since the sensing array 110 and the light emitting array 120 overlap each other, signal interference may occur. To prevent this from happening, a third embodiment is provided.

Figure 20:
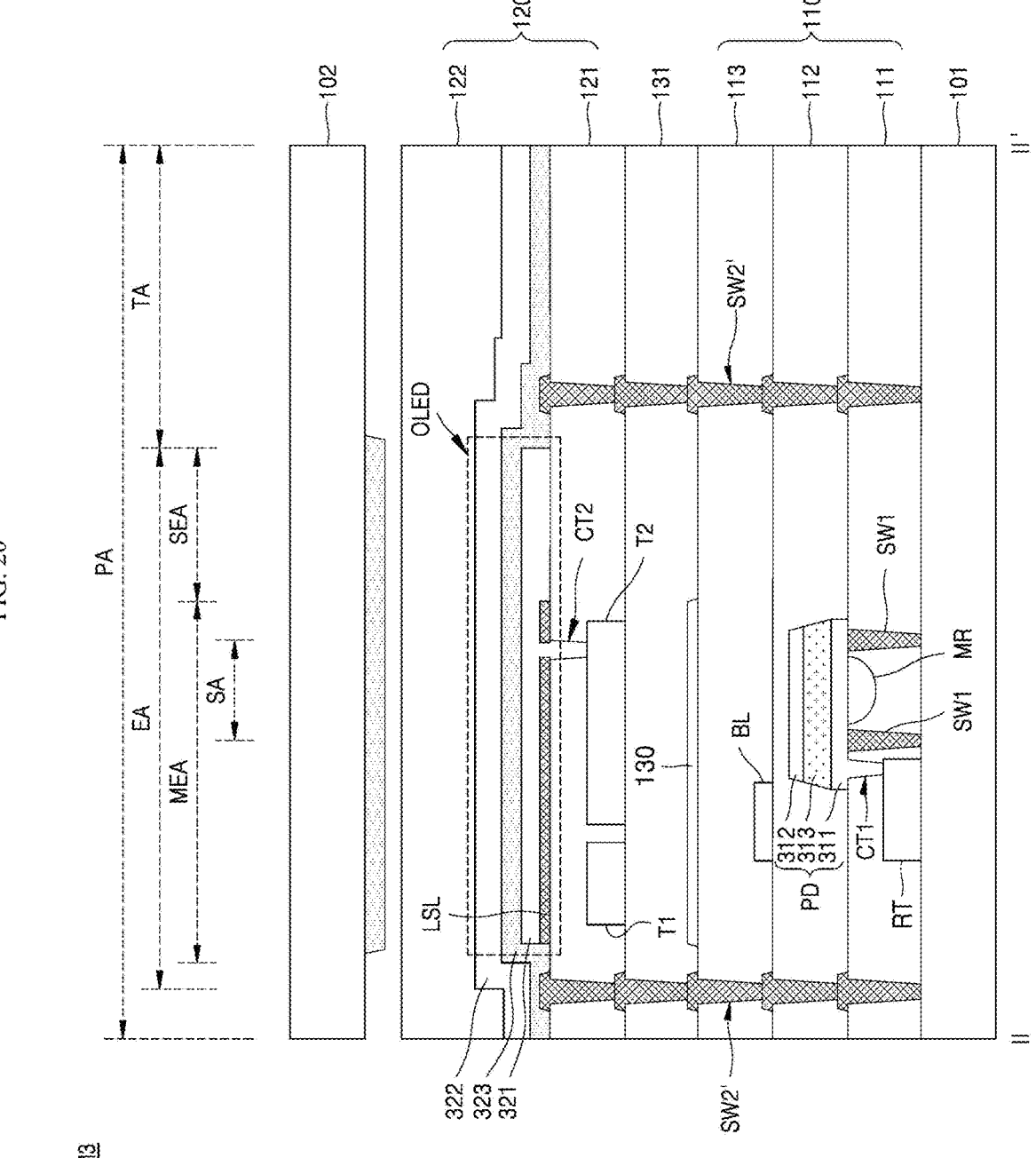
FIG. 20 is a view showing a cross section along II-II' of FIG. 13 in a third embodiment.

FIG. 20 is a view showing a cross section along II-II' of FIG. 13 in a third embodiment.

As illustrated in FIG. 20, a flat panel EM3 in a third embodiment is the same as those in the first and second embodiments except that the flat panel EM3 in the third embodiment further includes an electromagnetic shielding pattern 130 disposed between the sensing array 110 and the light emitting array 120, and a secondary protective film 131 covering the electromagnetic shielding pattern 130 and that the light emitting array 120 is disposed on the secondary protective film 131. Hereafter, a repetition of description is avoided.

The electromagnetic shielding pattern 130 is disposed on the third protective film 113 that is the uppermost portion of the sensing array 110 and covers the bias line BL.

The electromagnetic shielding pattern 130 is to block signal interference among the read-out circuit RT, the light sensing element PD, and the light emitting-driving circuit T1, T2 that overlap one another in the main light emitting area MEA. The electromagnetic pattern 130 corresponds to the main light emitting area MEA together with the read-out circuit RT, the light sensing element PD and the light emitting-driving circuit T1, T2. Accordingly, the electromagnetic shielding pattern 130 overlaps the light shielding-reflecting layer LSL corresponding to the main light emitting area MEA.

The secondary protective film 131 is disposed on the third protective film 113 and covers the electromagnetic shielding pattern 130.

The light emitting array 120 is disposed on the secondary protective film 131.

Additionally, the second light shielding wall SW2 may be implemented as a structure in which a signal-layer pattern passing through the secondary protective film 131 is further included.

As described above, the flat panel EM1, EM2, EM3 in each of the embodiments includes the micro lens MR corresponding to the light sensing area SA of each pixel area PA, the first light shielding wall SW1 corresponding to the edge of the light sensing area SA of each pixel area PA, and the light shielding-reflecting layer LSL corresponding to the main light emitting area MEA of each pixel area PA and disposed under of the light emitting element OLED.

With the micro lens MR, the first light shielding wall SW1 and the light shielding-reflecting layer LSL, light delivered to the light sensing element PD of each pixel area PA is limited to light emitted from the light emitting element of each pixel area PA, reflected from an object to be scanned 20 disposed under the first support board 101 and converged by the micro lens MR. Thus, the accuracy of a detection signal Rdata generated by the light sensing element PD may improve.

That is, since the flat panel EM1 in the first embodiment includes the plurality of pixel areas PA including the light transmitting area TA respectively, the flat panel EM1 may look transparent and ensure improvement in the accuracy of a detection signal Rdata generated by the light sensing element PD.

Additionally, the flat panel EM2 in the second embodiment further includes the second light shielding wall SW2 that surrounds the light emitting area EA of each pixel area PA. The second light shielding wall SW2 may block a light path between adjacent pixel areas PA. That is, the light sensing element PD of each pixel area PA may not be exposed to light generated in an adjacent pixel area. Thus, the accuracy of a detection signal Rdata generated by the light sensing element PD may improve further.

Further, the flat panel EM3 in the third embodiment further includes the electromagnetic shielding pattern 130 disposed between the sensing array 110 and the light emitting array 120. Accordingly, signal interference between the sensing array 110 and the light emitting array 120 may be blocked, resulting in a decrease in the distortion of a driving signal provided to the light emitting area EA of each pixel area PA and the distortion of a detection signal Rdata read out in the light sensing element PD of each pixel area PA.

The subject matter of the disclosure is not limited by the embodiments and drawings set forth herein, and replacements, modifications and changes can be made by one having ordinary skill in the art without departing from the technical spirit of the disclosure.

What is claimed is:

1. A flat panel comprising a plurality of pixel areas arranged in parallel with each other, each of the plurality of pixel areas comprising a light emitting area emitting light, a light transmitting area adjacent to the light emitting area and transmitting light, and a light sensing area in a portion of the light emitting area and sensing light, the flat panel comprising:

a first support board of a transparent material;
a sensing array disposed on the first support board, the sensing array comprising:
a light sensing element corresponding to the light sensing area of each of the plurality of pixel areas,
a micro lens corresponding to the light sensing area of each of the plurality of pixel areas between the first support board and the respective light sensing element of the corresponding light sensing area, and
a first light shielding wall corresponding to the light sensing area of each of the plurality of pixel areas between the first support board and the respective light sensing element and corresponding to an edge of the corresponding light sensing area of each of the plurality of pixel areas;
a light emitting array disposed on the sensing array, the light emitting array comprising a light emitting element corresponding to the light emitting area of each of the plurality of pixel areas, wherein the light emitting area includes a main light emitting area and a sub light emitting area;

a second support board disposed on the light emitting array and facing the first support board; and a light shielding-reflective layer disposed corresponding to the main light emitting area of the light emitting area, wherein the light sensing element is disposed to overlap with the light shielding-reflective layer at a lower side, wherein the main light emitting area of the light emitting area emits light toward one side facing the second support board, wherein the sub light emitting area of the light emitting area emits light toward both sides facing the first support board and the second support board, and wherein, in the light sensing area of each of the plurality of pixel area, a path from a lower surface of the first support board to the micro lens is configured to transmit light.

2. The flat panel of claim 1, wherein the sensing array further comprises:

a read-out circuit disposed on the first support board and corresponding to the each of the plurality of pixel areas; and a first protective film covering the read-out circuit, wherein the light sensing element is disposed on the first protective film, wherein the micro lens is concavely disposed on the first protective film, and wherein the first light shielding wall passes through the first protective film and surrounds the micro lens.

3. The flat panel of claim 2, wherein the light sensing element comprises a pixel electrode and a bias electrode that face each other, and a PIN layer that is disposed between the pixel electrode and the bias electrode, and wherein the pixel electrode is disposed on the first protective film and the micro lens, is connected to a read-out transistor through a contact hole passing through the first protective film, and overlaps the micro lens.

4. The flat panel of claim 3, wherein the sensing array, further comprises:

a second protective film disposed on the first protective film and covering the light sensing element; and a bias line disposed on the second protective film, wherein the bias line connects to the bias electrode of the light sensing element through a bias contact hole passing through the second protective film.

5. The flat panel of claim 4, the sensing array, further comprising:

a third protective film covering the bias line, wherein the light emitting array further comprises:

a light emitting-driving circuit disposed on the third protective film and corresponding to each of the plurality of pixel areas; and a fourth protective film disposed on the third protective film and covering the light emitting-driving circuit, wherein the light emitting element is disposed on the fourth protective film.

6. The flat panel of claim 5, wherein the light emitting element comprises a first electrode and a second electrode that face each other, and a light emitting layer that is disposed between the first electrode and the second electrode, wherein the first electrode is disposed on the fourth protective film, corresponds to both the main light emitting area and the sub light emitting area of the light emitting area of each of the plurality of pixel areas and connects to a driving transistor of the light emitting-driving circuit through a contact hole passing through the fourth protective film, wherein the light emitting layer is disposed on the first electrode, and wherein the second electrode is disposed on the light emitting layer.

7. The flat panel of claim 6 wherein each of the first electrode and the second electrode include a transparent conductive material or a semitransparent conductive material.

8. The flat panel of claim 7, wherein the light emitting array disposed between the fourth protective film and the first electrode and light shielding-reflective layer disposed on the fourth protective film.

9. The flat panel of claim 8, wherein the light shielding-reflecting layer overlaps the read-out circuit, the light sensing element, and the light emitting-driving circuit.

10. The flat panel of claim 8, wherein the light sensing element generated a detection signal, based on an amount of light that is emitted from the sub light emitting area to the first support board, reflected from an object to be scanned disposed under the first support board and input through the micro lens, wherein the micro lens has a higher refractive index than the first protective film, and wherein the first protective film has a higher refractive index than the first support board.

11. The flat panel of claim 10, wherein the third protective film has a higher refractive index than the fourth protective film, wherein the second protective film has a higher refractive index than the third protective film, and wherein the first protective film has a higher refractive index than the second protective film.

12. The flat panel of claim 5, wherein the flat panel further comprises a second light shielding wall disposed on the first support board and surrounding the light emitting area of each of the plurality of pixel areas, and wherein the second light shielding wall comprises single-layer patterns respectively disposed on the first support board, the first protective film, the second protective film film, and the third protective film and overlapping one another.

13. The flat panel of claim 12, wherein at least one of the single-layer patterns of the second light shielding wall has an open shape, and wherein the second light shielding wall is insulated from the read-out circuit, a scan line and a read-out line connected to the read-out circuit, the bias line, the light emitting-driving circuit and a gate line and a data line connected to the light emitting-driving circuit respectively.

14. The flat panel of claim 5, wherein the flat panel further comprises an electromagnetic shielding pattern disposed between the sensing array and the light emitting array and overlapping the read-out circuit, the light sensing element, and the light emitting-driving circuit, respectively.

15. The flat panel of claim 14, wherein the electromagnetic shielding pattern is disposed on the third protective film covering the bias line and covered by a secondary protective film, and wherein the light emitting-driving circuit is disposed on the secondary protective film.

16. A scanning device, comprising a flat panel according to claim 1; and a side part fixed to an edge of at least one side of the flat panel and accommodating a panel driver driving the flat panel, wherein the panel driver reads out a detection signal of each light sensing element from the sensing array of the flat panel and provides a driving signal for driving an light emitting element included in the light emitting array of the flat panel.

17. The flat panel of claim 1, wherein the light sensing area of each of the plurality of pixel areas includes the light sensing element and the micro lens array on a one to-one correspondence.

\* \* \* \* \*